US012615883B2

(12) United States Patent
Shin et al.

(10) Patent No.: US 12,615,883 B2
(45) Date of Patent: Apr. 28, 2026

(54) NANOROD LIGHT EMITTING ELEMENT AND DISPLAY DEVICE INCLUDING THE SAME

(71) Applicant: LG DISPLAY CO., LTD., Seoul (KR)

(72) Inventors: Yuseop Shin, Bucheon-si (KR); YongSeok Kwak, Paju-si (KR); MinJae Kang, Seoul (KR)

(73) Assignee: LG Display Co., Ltd (KR)

( * ) Notice: Subject to any disclaimer, the term of this patent is extended or adjusted under 35 U.S.C. 154(b) by 705 days.

(21) Appl. No.: 17/976,538

(22) Filed: Oct. 28, 2022

(65) Prior Publication Data

US 2023/0215975 A1 Jul. 6, 2023

(30) Foreign Application Priority Data

Dec. 30, 2021 (KR) ........................ 10-2021-0193152

(51) Int. Cl.
H10H 20/819 (2025.01)
H01L 25/075 (2006.01)
H10H 20/857 (2025.01)
(52) U.S. Cl.
CPC ....... H10H 20/819 (2025.01); H01L 25/0753 (2013.01); H10H 20/857 (2025.01)
(58) Field of Classification Search
CPC .. H10H 20/819; H10H 20/857; H10H 20/821; H10H 20/813; H10H 20/812; H10H 29/142; H01L 25/0753
See application file for complete search history.

(56) References Cited

U.S. PATENT DOCUMENTS

| | | | |
|---|---|---|---|
| 2015/0340552 A1 | 11/2015 | Amstatt | |
| 2019/0229131 A1 | 7/2019 | Chung et al. | |
| 2022/0005979 A1* | 1/2022 | Kang | .................. H01L 25/0753 |

FOREIGN PATENT DOCUMENTS

| | | |
|---|---|---|
| JP | 2014-165214 A | 9/2014 |
| KR | 10-2020-0088934 A | 7/2020 |

OTHER PUBLICATIONS

UK Combined Search and Examination Report dated Apr. 27, 2023 issued in Patent Application No. GB2215947.9 (6 pages).
Office Action in Indian Appln. No. 202214067538, mailed on Aug. 8, 2025, 8 pages (with English translation).

* cited by examiner

*Primary Examiner* — Latanya N Crawford Eason
(74) *Attorney, Agent, or Firm* — Fish & Richardson P.C.

(57) ABSTRACT

A nanorod light emitting element includes a first semiconductor layer having a rod shape, a first active layer covering a first portion of a side surface of the first semiconductor layer, the first portion extending from an upper surface of the first semiconductor layer, a second semiconductor layer covering the first active layer, a second active layer covering a second portion of the side surface, the second portion extending from a lower surface of the first semiconductor layer, and spaced apart from the first active layer, and a third semiconductor layer covering the second active layer and spaced apart from the second semiconductor layer.

18 Claims, 19 Drawing Sheets

IL
BF
WF

131
IL
BF
WF

PR1
133m
132m
131
IL
BF
WF

MS
PR1
133m
132m
131
IL
BF
WF 133a
132a

133b
IL
BF
WF 131 132b

130

133a

131

132b

133b

NANOROD LIGHT EMITTING ELEMENT AND DISPLAY DEVICE INCLUDING THE SAME

CROSS-REFERENCE TO RELATED APPLICATION

This application claims the priority to Korean Patent Application No. 10-2021-0193152 filed on Dec. 30, 2021, which is hereby incorporated by reference in its entirety.

BACKGROUND

Field of the Disclosure

The present disclosure relates to a nanorod light emitting element and a display device including the same, and more particularly, to a nanorod light emitting element allowing for a repair process and a display device including the same.

Description of the Background

Display devices used in computer monitors, TVs, and mobile phones include organic light emitting displays (OLEDs) that emit light by themselves, and liquid crystal displays (LCDs) that require a separate light source.

Display devices are being applied to more and more various fields including not only computer monitors and TVs, but also personal mobile devices, and thus, display devices having a reduced volume and weight while having a wide active area are being studied.

In recent years, display devices including light emitting diodes (LEDs) have received attention as next-generation display devices. Since the LED is formed of an inorganic material rather than an organic material, it has excellent reliability and has a longer lifespan compared to a liquid crystal display or an organic light emitting display. In addition, the LED has a high lighting speed, high luminous efficiency and excellent stability due to high impact resistance and can display a high-luminance image.

SUMMARY

The present disclosure is to provide a nanorod light emitting element capable of improving luminance uniformity and luminous efficiency by controlling the number of light sources in sub-pixels, and a display device including the same.

The present disclosure is also to provide a nanorod light emitting element allowing for a reduction in manufacturing cost of a display device by reducing a process procedure that is consumed in a repair process, and a display device including the same.

The present disclosure is not limited to the above-mentioned and other features, which are not mentioned above, can be clearly understood by those skilled in the art from the following descriptions.

To achieve these and other advantages and in accordance with the present disclosure, as embodied and broadly described, a nanorod light emitting element includes a first semiconductor layer having a rod shape, a first active layer covering a first portion of a side surface of the first semiconductor layer, the first portion extending from an upper surface of the first semiconductor layer, a second semiconductor layer covering the first active layer, a second active layer covering a second portion of the side surface, the second portion extending from a lower surface of the first semiconductor layer, and spaced apart from the first active layer, and a third semiconductor layer covering the second active layer and spaced apart from the second semiconductor layer.

In another aspect of the present disclosure, a display device includes a substrate including an active area including a plurality of sub-pixels and a non-active area surrounding the active area, a first transistor disposed on the substrate, a planarization layer disposed on the first transistor, a first alignment lines disposed on the planarization layer, a second alignment lines positioned on both sides of the first alignment lines, a first insulating layer disposed to cover the second alignment lines, a nanorod light emitting element disposed on the first alignment line and the first insulating layer, a second insulating layer disposed on the nanorod light emitting element and exposing one semiconductor layer among the second semiconductor layer and the third semiconductor layer, and a first connection line connecting the first transistor and the one semiconductor layer.

In a further aspect of the present disclosure, a display device includes a substrate and a plurality of sub-pixels disposed on the substrate, and one of the plurality of sub-pixels includes a plurality of nanorod light emitting elements, each of which is the nanorod light emitting element mentioned above.

According to the present disclosure, a plurality of light emitting elements can be self-aligned at specific positions of a substrate.

According to the present disclosure, luminance uniformity can be improved by forming two light emitting areas in one light emitting element and selectively using the two light emitting areas.

According to the present disclosure, by disposing a first electrode in a central portion of a light emitting element and disposing a plurality of second electrodes on both sides of the light emitting element, a repair configuration can be facilitated and a process procedure consumed in a repair process can be reduced.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1A:
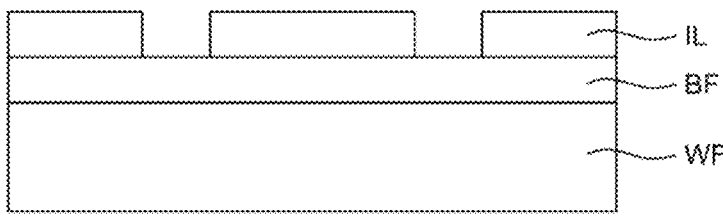
FIGS. 1A to 1J are process views for explaining a manufacturing method of a light emitting element according to an aspect of the present disclosure.

Advantages and characteristics of the present disclosure and a method of achieving the advantages and characteristics will be clear by referring to aspects described below in detail together with the accompanying drawings. However, the present disclosure is not limited to the aspects disclosed herein but will be implemented in various forms. The aspects are provided by way of example only. Therefore, the present disclosure will be defined by the scope of the appended claims.

The shapes, sizes, ratios, angles, numbers, and the like illustrated in the accompanying drawings for describing the aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a stretchable display device according to aspects of the present disclosure will be described in detail with reference to accompanying drawings.

FIGS. 1A to 1J are process views for explaining a manufacturing method of a light emitting element according to an aspect of the present disclosure.

Referring to FIG. 1A, a buffer layer BF and an insulating layer IL are formed on a growth substrate WF. The buffer layer BF covers the growth substrate WF so that moisture or impurities do not diffuse from the growth substrate WF to an upper structure. The buffer layer BF may be formed by metal organic chemical vapor deposition (MOCVD). Then, the insulating layer IL is formed on the buffer layer BF. The insulating layer IL may include a plurality of holes. That is, the insulating layer IL may be patterned and disposed on the buffer layer BF. Accordingly, an upper surface of the buffer layer BF may be partially exposed by the holes of the insulating layer IL.

Figure 1B:
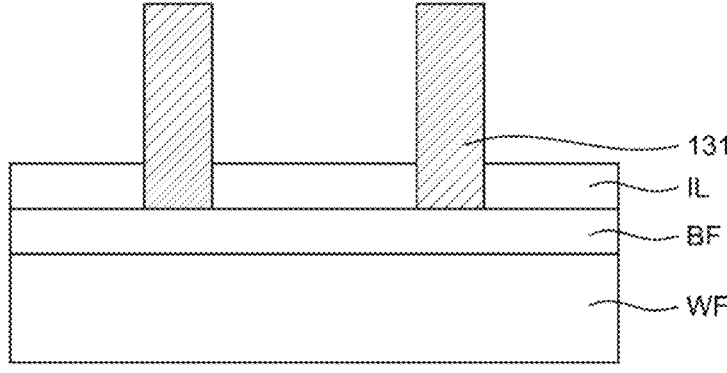

Referring to FIG. 1B, first semiconductor layers 131 are formed on the upper surface of the buffer layer BF that is exposed from the holes of the insulating layer IL. For example, the first semiconductor layer 131 may be formed by growing a rod-shaped semiconductor crystal using a material constituting the first semiconductor layer 131 by metal organic chemical vapor deposition (MOCVD). The first semiconductor layer may alternatively be described as a semiconductor rod. Therefore, the terms "first semiconductor layer" and "first semiconductor rod" are used interchangeably throughout this disclosure.

The first semiconductor layer 131 may be a layer formed by doping a specific material with an n-type impurity. The first semiconductor layer 131 may be a layer in which a material such as gallium nitride (GaN), indium aluminum phosphide (InAlP), and gallium arsenide (GaAs) is doped with an n-type impurity. The n-type impurity may be silicon (Si), germanium (Ge), tin (Sn), or the like, but the present disclosure is not limited thereto.

Figure 1C:
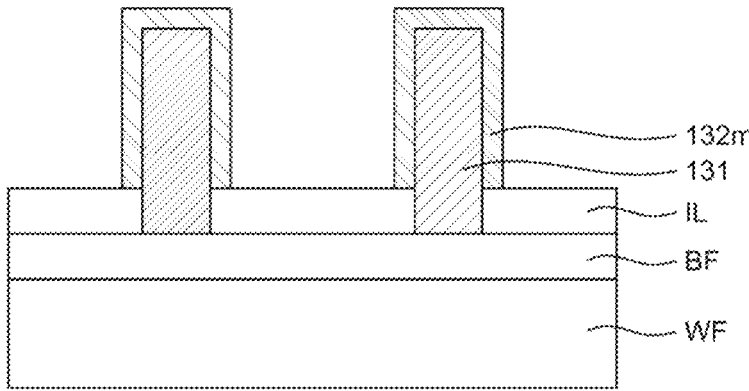

Referring to FIG. 1C, active material layers 132*m* may be formed on the first semiconductor layers 131. The active material layer 132*m* may be disposed to surround an upper surface and a side surface of the first semiconductor layer 131. The active material layer 132*m* may have a single-layer or multi-quantum well (MQW) structure, and may be formed of, for example, indium gallium nitride (InGaN), gallium nitride (GaN) or the like, but the present disclosure is limited thereto. The active material layer 132*m* may be formed by, for example, metal organic chemical vapor deposition (MOCVD). In this case, the active material layer 132*m* may be grown by inheriting crystallinity of the first semiconductor layer 131.

Figure 1D:
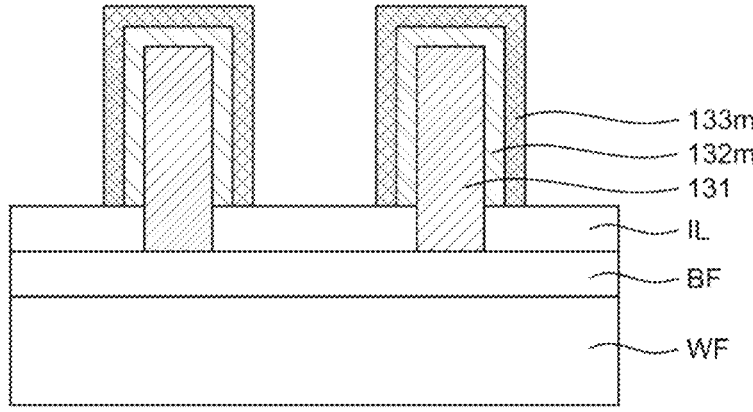

Referring to FIG. 1D, second semiconductor material layers 133*m* are formed on the active material layers 132*m*. The second semiconductor material layer 133*m* may be disposed to surround an upper surface and a side surface of the active material layer 132*m*. The second semiconductor material layer 133*m* may be a layer formed by doping a specific material with a p-type impurity. For example, the second semiconductor material layer 133*m* may be a layer in which a material such as gallium nitride (GaN), indium aluminum phosphide (InAlP), or gallium arsenide (GaAs) is doped with a p-type impurity. In addition, the p-type impurity may be magnesium (Mg), zinc (Zn), beryllium (Be) or the like, but the present disclosure is not limited thereto. For example, the second semiconductor material layer 133*m* may be formed by metal organic chemical vapor deposition (MOCVD). Accordingly, the second semiconductor material layer 133*m* may be grown by inheriting crystallinity of the active material layer 132*m*.

Figure 1E:
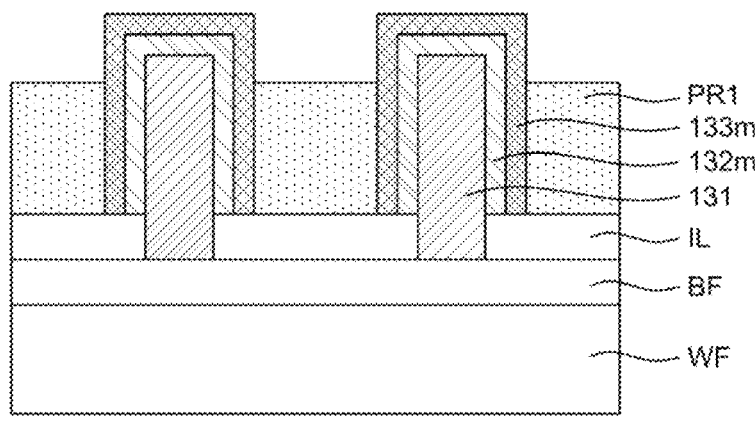

Referring to FIG. 1E, a first temporary protective layer PR1 is formed on portions where the first semiconductor layer 131, the active material layer 132*m*, and the second semiconductor material layer 133*m* are not disposed on the growth substrate WF. The first temporary protective layer PR1 may be formed by, for example, coating photoresist (PR) and performing etching through an ashing process, but the present disclosure is not limited thereto. In this case, the first temporary protective layer PR1 is disposed to cover only a portion of a side surface extending from a lower surface of the second semiconductor material layer 133*m*.

Figure 1F:
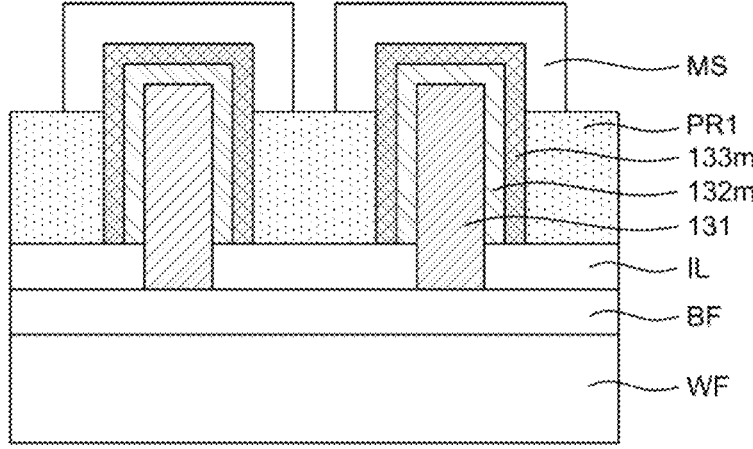

Referring to FIG. 1F, a mask MS is formed on the first temporary protective layer PR1 and the second semiconductor material layer 133*m*. The mask MS is formed on a portion of the side surface and an upper surface of the second semiconductor material layer 133*m* that are exposed from the first temporary protection layer PR1. For example, the mask MS may be formed of silicon oxide (SiO$_2$).

Figure 1G:
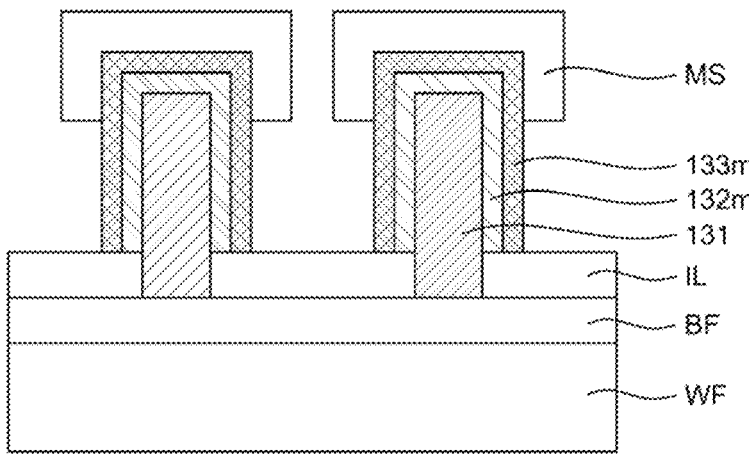

Referring to FIG. 1G, the first temporary protective layer PR1 that is disposed between the insulating layer IL and the mask MS is removed. Accordingly, an upper surface of the insulating layer IL and the portion of the side surface extending from the lower surface of the second semiconductor material layer 133*m* may be exposed.

Figure 1H:
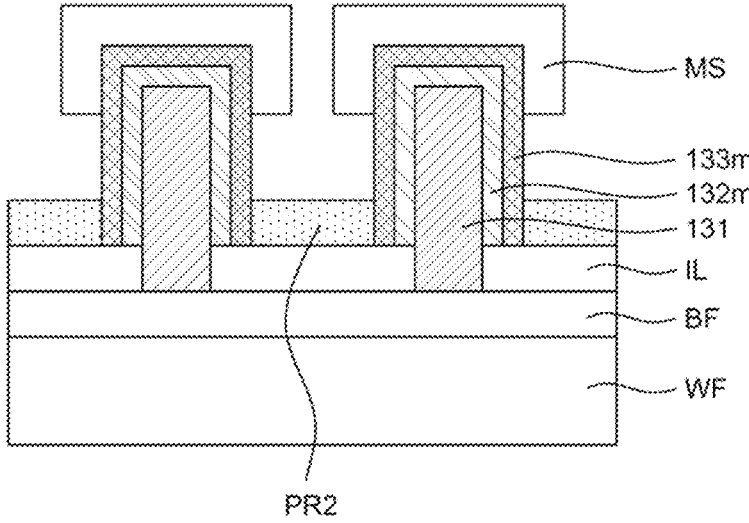

Referring to FIG. 1H, a second temporary protective layer PR2 is formed on the insulating layer IL. In this case, the second temporary protective layer PR2 is formed at a height at which a portion of the side surface of the second semiconductor material layer 133*m* is exposed.

Figure 1I:
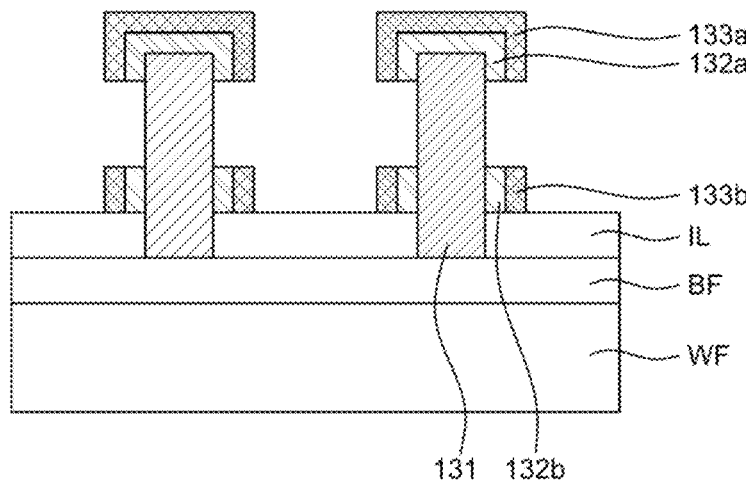

Referring to FIG. 1I, a portion of the side surface of the second semiconductor material layer 133*m* that is exposed from the second temporary protective layer PR2 and the mask MS, and a portion of the side surface of the active material layer 132*m* that overlaps the exposed second semiconductor material layer 133*m* are removed. As a method of removing the second semiconductor material layer 133*m* and the active material layer 132*m*, for example, an inductively coupled plasma (IPC) etching method may be used, but the present disclosure is not limited thereto. Accordingly, the second semiconductor material layer 133*m* may be separated into a second semiconductor layer 133*a* and a third semiconductor layer 133*b*, and the active material layer 132*m* may be separated into a first active layer 132*a* and a second active layer 132*b*.

Figure 1J:
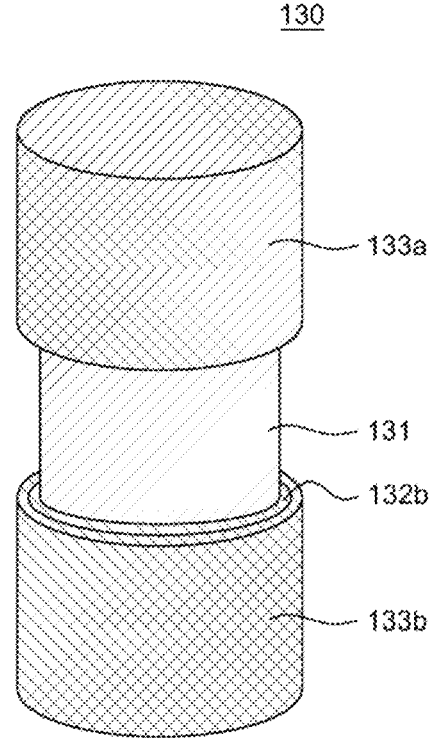

Next, the second temporary protective layer PR2 is removed, and the first semiconductor layer 131, the first active layer 132*a*, the second active layer 132*b*, the second semiconductor layer 133*a*, and the third semiconductor layer 133*b* that are disposed on the growth substrate WF are separated from the growth substrate WF, whereby nanorod light emitting elements 130 as shown in FIG. 1J may be formed. Specifically, the second temporary protective layer PR2 is removed, and the first semiconductor layer 131 is cut based on a boundary between the second active layer 132*b* and the third semiconductor layer 133*b* and the insulating layer IL, so that the nanorod light emitting element 130 having a rod shape may be formed.

Referring to FIG. 1J, the light emitting element 130 may be a dumbbell-shaped nanorod light emitting element 130 including the first semiconductor layer 131, the first active layer 132*a*, the second active layer 132*b*, the second semiconductor layer 133*a*, and the third semiconductor layer 133*b*.

The first active layer 132*a* covers a portion of the side surface extending from the upper surface of the first semiconductor layer 131 and covers an entirety of the upper surface of the first semiconductor layer 131. The first active layer 132*a* may receive holes and electrons from the first semiconductor layer 131, the second semiconductor layer

133*a* and the third semiconductor layer 133*b* and emit light. The first active layer 132*a* may have a single-layer or multi-quantum well (MQW) structure, and may be formed of, for example, indium gallium nitride (InGaN), gallium nitride (GaN) or the like, but the present disclosure is not limited thereto.

The second active layer 132*b* covers a portion of the side surface extending from a lower surface of the first semiconductor layer 131 and is spaced apart from the first active layer 132*a*. That is, a partial area positioned in a central portion of the side surface of the first semiconductor layer 131 may be exposed to the outside by the first active layer 132*a* and the second active layer 132*b*. The second active layer 132*b* may be formed of the same material as the first active layer 132*a*. Referring to FIGS. 1A to 1I, a lower surface of the second active layer 132*b* is a portion that is separated from the growth substrate WF. Accordingly, the second active layer 132*b* may expose the lower surface of the first semiconductor layer 131.

The second semiconductor layer 133*a* covers the first active layer 132*a*. Accordingly, the second semiconductor layer 133*a* may cover an entirety of the upper surface of the first semiconductor layer 131. The second semiconductor layer 133*a* may be formed of the same material as the second semiconductor material layer 133*m*.

The third semiconductor layer 133*b* covers the second active layer 132*b* and is spaced apart from the second semiconductor layer 133*a*. That is, a partial area positioned in the central portion of the side surface of the first semiconductor layer 131 may be exposed to the outside by the third semiconductor layer 133*b* and the second semiconductor layer 133*a*. In this case, the third semiconductor layer 133*b* may be formed of the same material as the second semiconductor layer 133*a*. Referring to FIGS. 1A to 1I, a lower surface of the third semiconductor layer 133*b* is a portion that is separated from the growth substrate WF. Accordingly, the third semiconductor layer 133*b* may expose the lower surface of the first semiconductor layer 131.

In general, in the case of a nanorod light emitting element, only one light emitting area exists in one light emitting element. That is, there is only one light emitting area by one n-type semiconductor layer, one active layer, and one p-type semiconductor layer. Accordingly, if any one of the n-type semiconductor layer, the active layer, and the p-type semiconductor layer, which are components of the light emitting element, is damaged or is not normally aligned during a manufacturing process of a display device, there occurs a defect in which the corresponding light emitting element does not emit light. When the light emitting element does not emit light as described above, a repair process may be very complicated and practically infeasible in that a manufacturing process needs to be performed once again to repair the display device.

Accordingly, the light emitting element 130 according to an aspect of the present disclosure is configured to include two light emitting areas, so that a repair process can be easily performed even in a display device 100. The light emitting element 130 may include one light emitting area that is formed by the first semiconductor layer 131 formed of an n-type semiconductor material, the first active layer 132*a*, and the second semiconductor layer 133*a* formed of a p-type semiconductor material, and the other light emitting area that is formed by the first semiconductor layer 131 formed of an n-type semiconductor material, the second active layer 132*b*, and the third semiconductor layer 133*b* formed of a p-type semiconductor material. Accordingly, even if components constituting one of the two light emitting areas are damaged or are not aligned normally, the light emitting element 130 may emit light using the other light emitting area. Accordingly, the light emitting element 130 according to an aspect of the present disclosure may be configured to include two light emitting areas, and the two light emitting areas may selectively emit light, so that when used in the display device 100, it is very advantageous in terms of a repair process, and allows for an improvement in luminance uniformity. A more detailed description of the repair process in the display device 100 will be provided later with reference to FIGS. 3 to 11.

Figure 2:
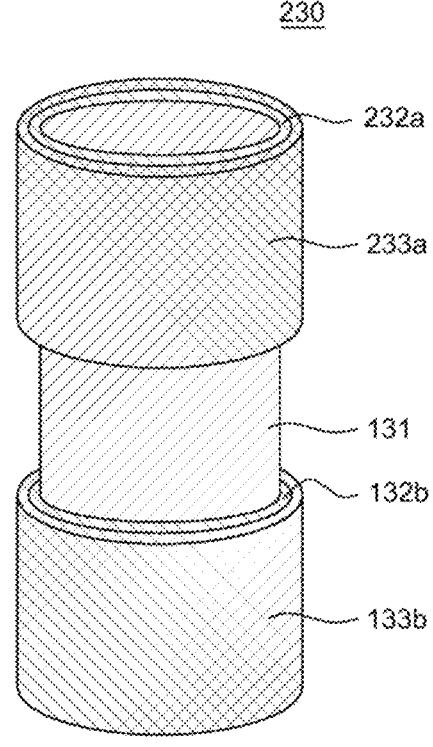
FIG. 2 is a perspective view of a light emitting element according to another aspect of the present disclosure.

FIG. 2 is a perspective view of a light emitting element according to another aspect of the present disclosure. A light emitting element 230 of FIG. 2 is different from the light emitting element 130 of FIGS. 1A to 1J only in terms of a first active layer 232a and a second semiconductor layer 233a but is substantially the same as the light emitting element 130 of FIGS. 1A to 1J. Thus, redundant descriptions thereof will be omitted.

Referring to FIG. 2, the first active layer 232a and the second semiconductor layer 233a of the light emitting element 230 may expose the upper surface of the first semiconductor layer 131. Specifically, a process of cutting a portion of an upper portion of the light emitting element 230 may be added after a manufacturing process of FIGS. 1A to 1I. That is, in order to manufacture the light emitting element 230 in a symmetrical structure, the first active layer 232a and the second semiconductor layer 233a positioned at the upper portion of the light emitting element 230 are cut, so that the upper surface of the first semiconductor layer 131 may be exposed.

The light emitting element 230 according to another aspect of the present disclosure is configured to include two light emitting areas, so that a repair process can be easily performed even in a display device 200. That is, the light emitting element 230 may include one light emitting area that is formed by the first semiconductor layer 131 formed of an n-type semiconductor material, the first active layer 232a, and the second semiconductor layer 233a formed of a p-type semiconductor material, and the other light emitting area that is formed by the first semiconductor layer 131 formed of an n-type semiconductor material, the second active layer 132b, and the third semiconductor layer 133b formed of a p-type semiconductor material. Accordingly, the light emitting element 230 according to another aspect of the present disclosure may be configured to include two light emitting areas, and the two light emitting areas may selectively emit light, so that when used in the display device 100, it is very advantageous in terms of a repair process, and allows for an improvement in luminance uniformity.

Figure 3:
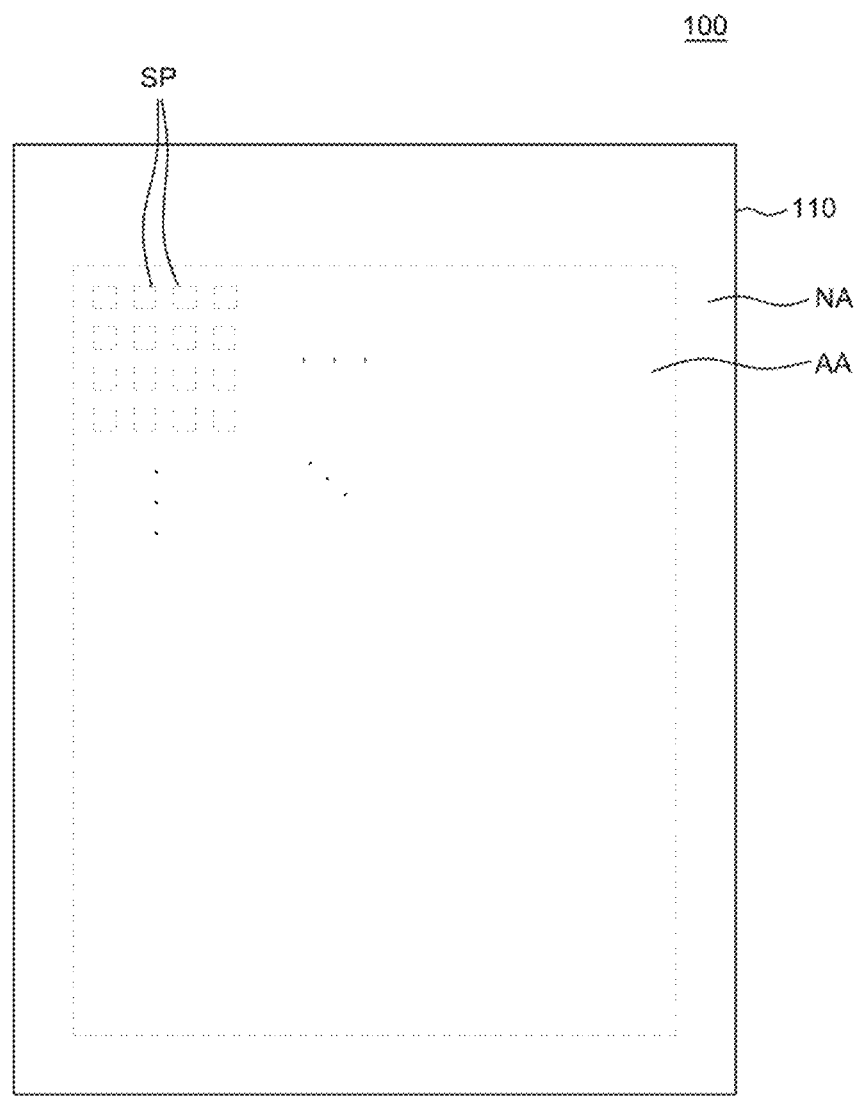
FIG. 3 is a schematic plan view of a display device according to an aspect of the present disclosure.

FIG. 3 is a schematic plan view of a display device according to an aspect of the present disclosure. In FIG. 3, only a substrate 110, an active area AA, a non-active area NA, and a plurality of sub-pixels SP among various components of the display device 100 are illustrated for convenience of explanation.

The substrate 110 is a component to support various components included in the display device 100 and may be formed of an insulating material. For example, the substrate 110 may be formed of glass, resin or the like. Also, the substrate 110 may be formed to include a polymer or plastic, and may be formed of a material having flexibility.

The substrate 110 includes the active area AA and the non-active area NA.

The active area AA is an area in which the plurality of sub-pixels SP are disposed to display an image. Each of the plurality of sub-pixels SP is an individual unit emitting light, and the light emitting element 130 and a driving circuit are formed in each of the plurality of sub-pixels SP. For example, the plurality of sub-pixels SP may include a red sub-pixel, a green sub-pixel, a blue sub-pixel, and/or a white sub-pixel, but the present disclosure is not limited thereto.

Meanwhile, a plurality of the light emitting elements 130 are disposed in one sub-pixel SP. In this case, the plurality of light emitting elements 130 may all emit light of the same color. A process in which the plurality of light emitting elements 130 are disposed in one sub-pixel will be described later with reference to FIGS. 4A to 4D.

The non-active area NA is an area in which no image is displayed, and is an area in which various lines, driver ICs and the like for driving the sub-pixels SP disposed in the active area AA are disposed. For example, various ICs and driving circuits such as a gate driver IC and a data driver IC may be disposed in the non-active area NA. Meanwhile, the non-active area NA may be formed on a rear surface of the substrate 110, that is, a surface without the sub-pixels SP or may be omitted, and is not limited to that illustrated in the drawings.

Hereinafter, a self-alignment process of the light emitting element 130 in a manufacturing method of the display device 100 will be described with reference to FIGS. 4A to 4D.

FIGS. 4A to 4D are views for explaining a manufacturing method of a display device according to an aspect of the present disclosure. FIGS. 4A to 4D illustrate only the self-alignment process of the light emitting element 130 in the manufacturing method of the display device 100.

Figure 4A:
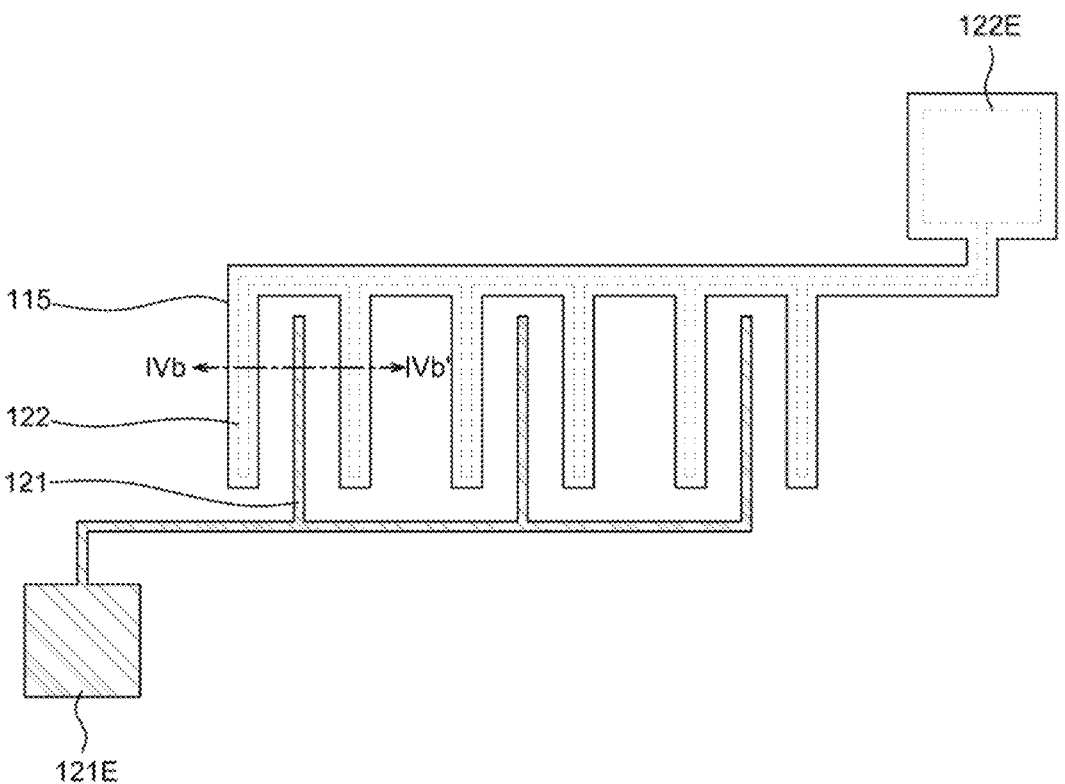
FIGS. 4A to 4D are views for explaining a manufacturing method of the display device according to an aspect of the present disclosure.
Figure 4B:
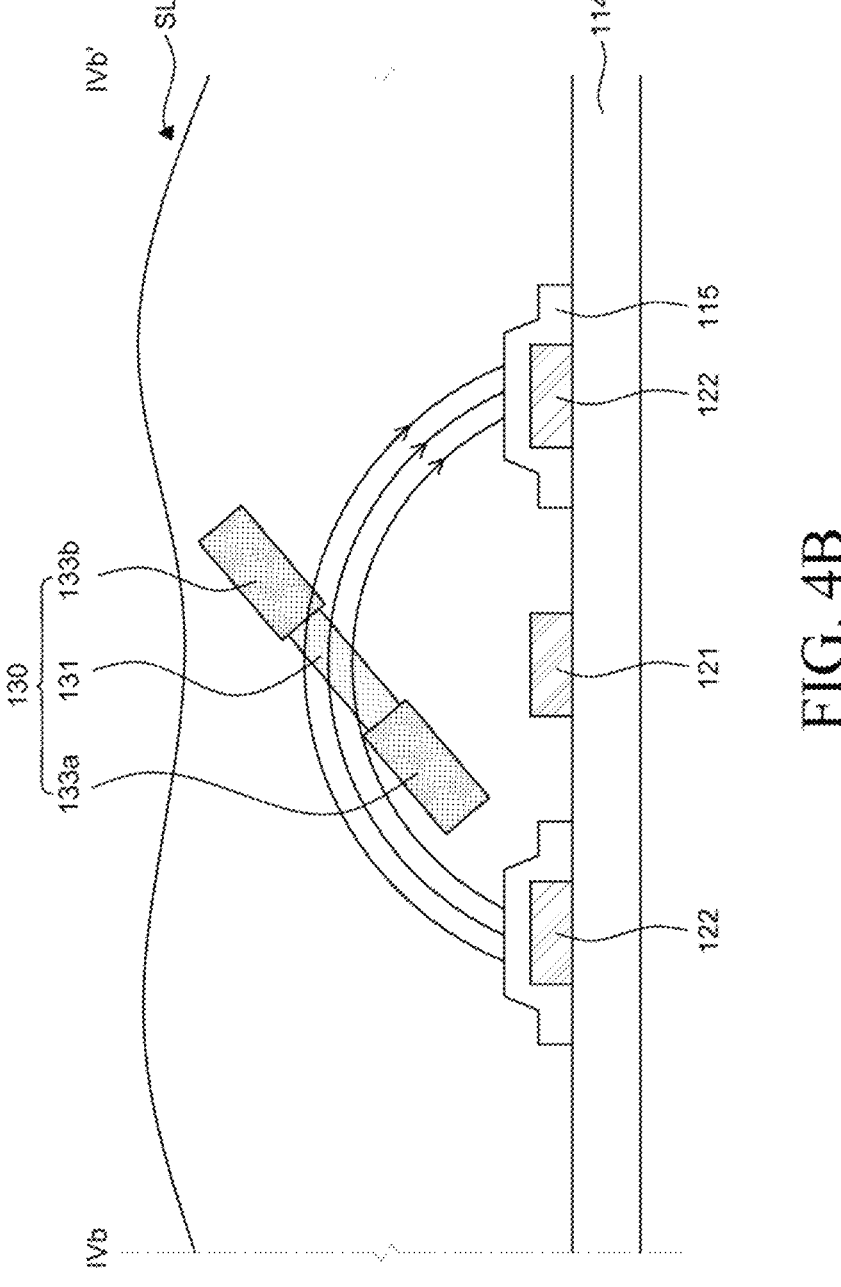

Although not shown in FIGS. 4A to 4B, various lines and transistors may be disposed on the substrate 110, and a planarization layer 114 for planarizing an upper portion of the transistors may be disposed. Accordingly, only the planarization layer 114 and components disposed on the planarization layer 114 are illustrated in FIGS. 4B and 4D.

Referring to FIG. 4A, a first alignment electrode 121E and first alignment lines 121 extending from the first alignment electrode 121E may be disposed on the planarization layer 114. Also, a second alignment electrode 122E and second alignment lines 122 extending from the second alignment electrode 122E may be disposed on both sides of the first alignment line 121 on the planarization layer 114. The first alignment line 121 and the second alignment line 122 may receive an electric signal from the outside for self-alignment of the light emitting element 130. In addition, a first insulating layer 115 is disposed on the second alignment line 122. The first insulating layer 115 is disposed to insulate the second alignment line 122.

The first alignment electrode 121E, the second alignment electrode 122E, the first alignment line 121 and the second alignment line 122 may be formed of a conductive material, for example, a material such as copper (Cu), chromium (Cr), molybdenum (Mo), molybdenum titanium (MoTi) or the like, but the present disclosure is not limited thereto.

The first insulating layer 115 may serve as an insulating layer that prevents short circuit defects due to migration between a plurality of the first alignment lines 121 and a plurality of the second alignment lines 122 when the display device 100 is manufactured. The first insulating layer 115 may be composed of a single layer or multilayers of silicon oxide (SiOx) or silicon nitride (SiNx), but the present disclosure is not limited thereto.

Referring to FIG. 4B, a solution SL in which the plurality of light emitting elements 130 are dispersed is applied onto the substrate 110 on which the plurality of first alignment lines 121, the plurality of second alignment lines 122, and the first insulating layer 115 are formed. Since the light emitting elements 130 are freely dispersed in the solution SL, they may not be aligned in a specific direction.

Then, the plurality of light emitting elements 130 may be self-aligned by applying a voltage to the plurality of first alignment lines 121 and the plurality of second alignment lines 122.

Specifically, electric fields may be formed by applying an alternating current (AC) voltage to the plurality of first alignment lines 121 and the plurality of second alignment lines 122. By this electric field, the light emitting element 130 may be dielectrically polarized and have a polarity. In addition, the dielectrically polarized light emitting element 130 may be moved or fixed in a specific direction by dielectrophoresis (DEP), that is, an electric field. Accordingly, the plurality of light emitting elements 130 may be aligned and fixed between the plurality of first alignment lines 121 and the plurality of second alignment lines 122 using dielectrophoresis.

Figure 4C:
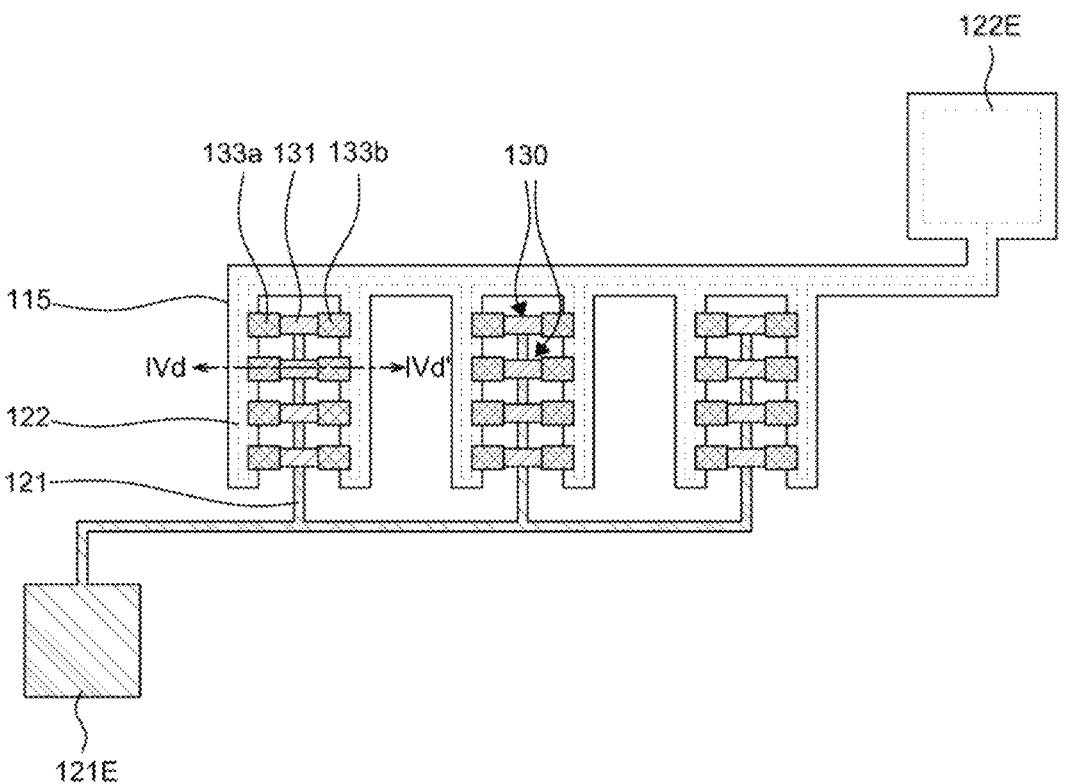
Figure 4D:
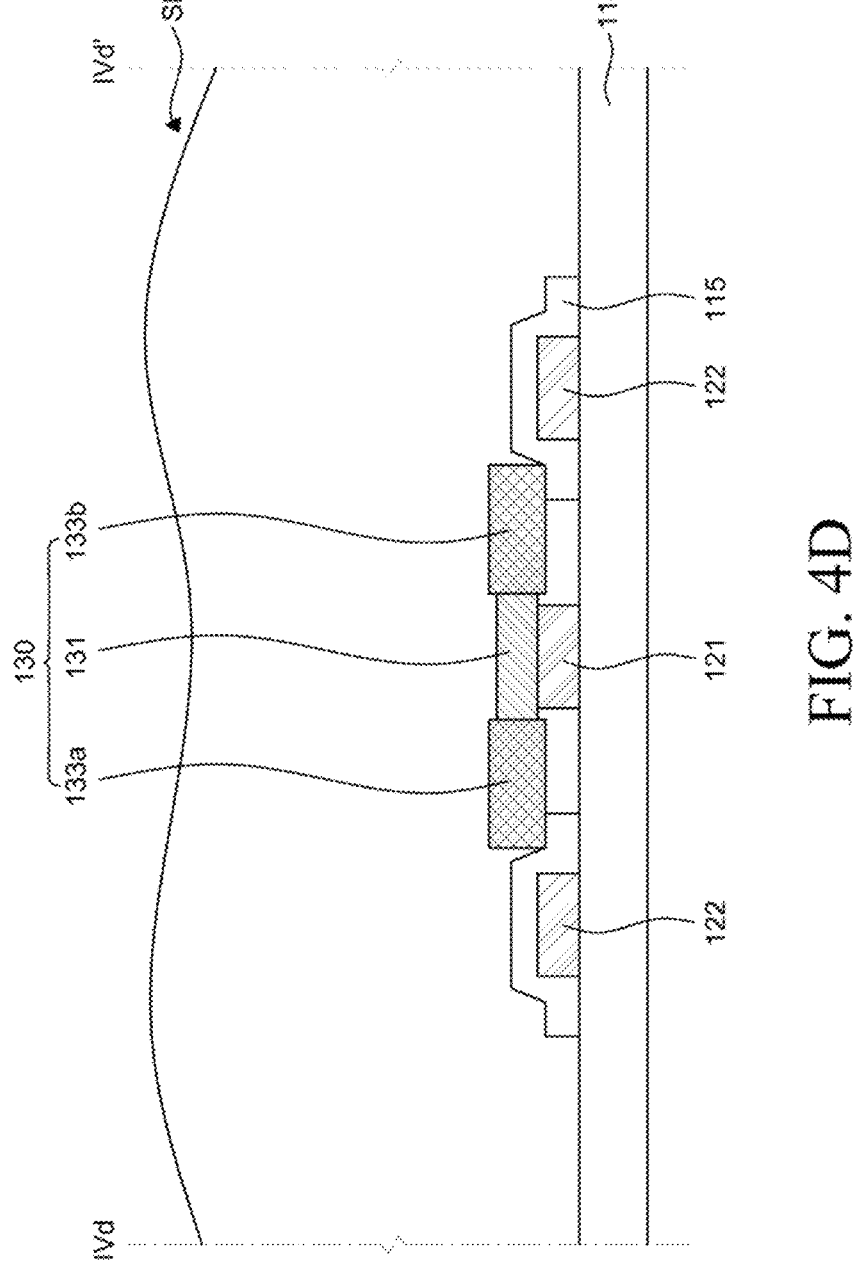

Referring to FIGS. 4C and 4D, central portions of the plurality of light emitting elements 130 may be aligned toward the first alignment lines 121 and both ends of the plurality of light emitting elements 130 may be aligned toward the second alignment lines 122 that are adjacent to the first alignment lines 121.

In this case, when electric fields for aligning the light emitting elements 130 are formed, different voltages may be easily applied to the plurality of first alignment lines 121 and the plurality of second alignment lines 122. For example, although not shown in the drawings, in the manufacturing process of the display device 100, voltages are applied from the outside to the first alignment electrode 121E and the second alignment electrode 122E that are connected to the plurality of first alignment lines 121 and the plurality of second alignment lines 122, respectively, through separate components, so that electric fields may be formed. Accordingly, electric fields for aligning the plurality of light emitting elements 130 may be formed by applying different voltages to the plurality of first alignment lines 121 and the plurality of second alignment lines 122. Accordingly, as shown in FIGS. 4C and 4D, the central portions of the plurality of light emitting elements 130 may be aligned toward the first alignment lines 121 and the both ends of the plurality of light emitting elements 130 may be aligned toward the second alignment lines 122 that are adjacent to the first alignment lines 121.

Hereinafter, FIGS. 5 and 6 will be referred to together for a more detailed description of the plurality of sub-pixels SP.

Figure 5:
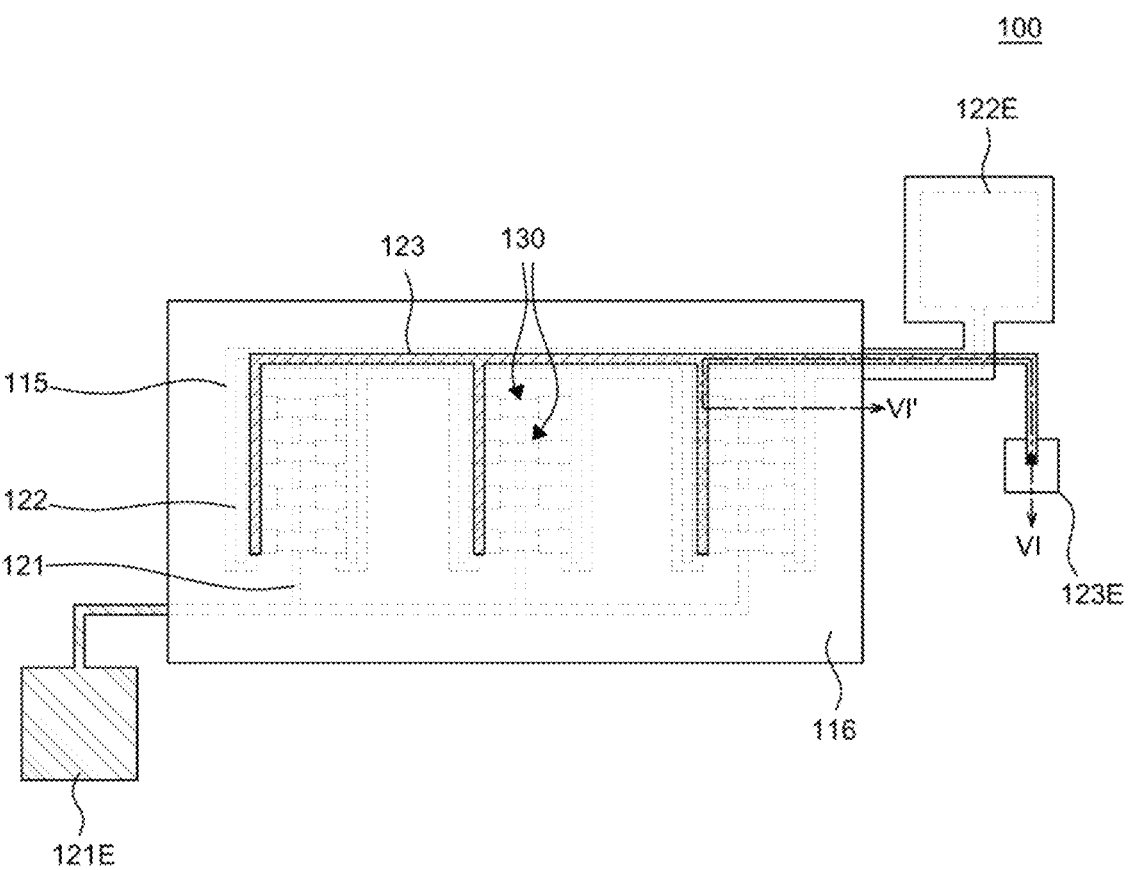
FIG. 5 is a plan view of the display device according to an aspect of the present disclosure.

FIG. 5 is a plan view of the display device according to an aspect of the present disclosure. FIG. 6 is a cross-sectional view taken along line VI-VI' of FIG. 5. FIG. 5 illustrates only one sub-pixel SP among the plurality of sub-pixels SP.

Figure 6:
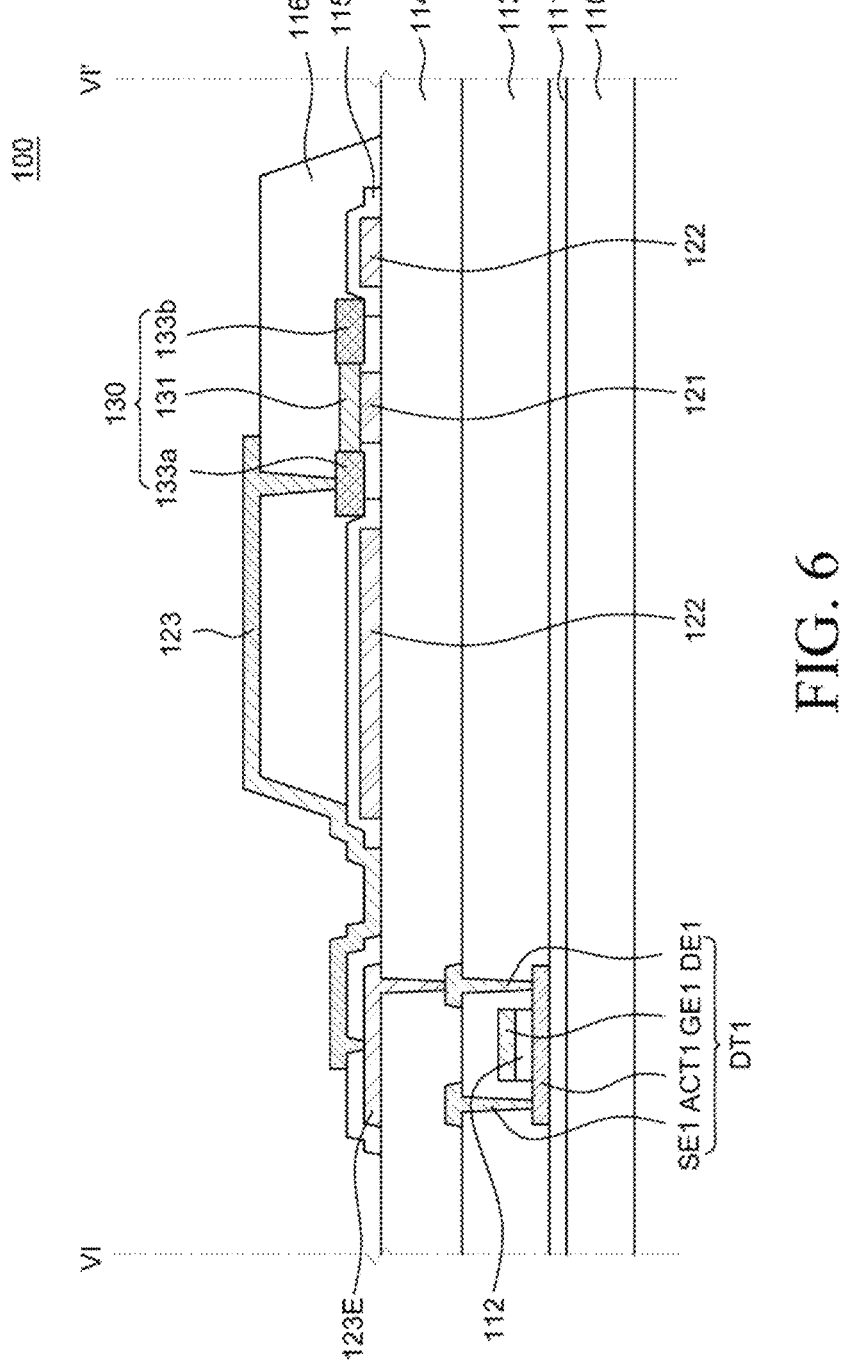
FIG. 6 is a cross-sectional view taken along line VI-VI' of FIG. 5.

Referring to FIGS. 5 and 6, a buffer layer 111, a first driving transistor DT1, a gate insulating layer 112, an interlayer insulating layer 113, the planarization layer 114, the first alignment lines 121, the second alignment lines 122, the first insulating layer 115, the plurality of light emitting elements 130, and first connection lines 123 are disposed on the substrate 110.

The buffer layer 111 is disposed on the substrate 110. The buffer layer 111 may reduce penetration of moisture or impurities through the substrate 110. The buffer layer 111 may be formed of, for example, a single layer or multilayers of silicon oxide (SiOx) or silicon nitride (SiNx), but is not limited thereto. However, the buffer layer 111 may be omitted depending on a type of the substrate 110 or a type of a thin film transistor, but the present disclosure is not limited thereto.

The first driving transistor DT1 is disposed on the buffer layer 111. The first driving transistor DT1 includes a first active layer ACT1, a first gate electrode GE1, a first source electrode SE1, and a first drain electrode DE1.

First, the first active layer ACT1 is disposed on the buffer layer 111. The first active layer ACT1 may be formed of a semiconductor material such as an oxide semiconductor, amorphous silicon, or polysilicon, but the present disclosure is not limited thereto.

The gate insulating layer 112 is disposed on the first active layer ACT1. The gate insulating layer 112 is an insulating layer for insulating the first active layer ACT1 and the gate electrode GE, and may be composed of a single layer or multiple layers of silicon oxide (SiOx) or silicon nitride (SiNx), but the present disclosure is not limited thereto.

The first gate electrode GE1 is disposed on the gate insulating layer 112. The first gate electrode GE1 may be formed of a conductive material, for example, copper (Cu), aluminum (Al), molybdenum (Mo), nickel (Ni), titanium (Ti), chromium (Cr), or an alloy thereof, but the present disclosure is not limited thereto.

The interlayer insulating layer 113 is disposed on the first gate electrode GE1. Contact holes for connecting each of the first source electrode SE1 and the first drain electrode DE1 to the first active layer ACT1 are formed in the interlayer insulating layer 113. The interlayer insulating layer 113 is an insulating layer for protecting components under the interlayer insulating layer 113, and may be composed of a single layer or multilayers of silicon oxide (SiOx) or silicon nitride (SiNx), but the present disclosure is not limited thereto.

The first source electrode SE1 and the first drain electrode DE1 are disposed on the interlayer insulating layer 113. Each of the first source electrode SE1 and the first drain electrode DE1 may be electrically connected to the first active layer ACT1 through the contact holes formed in the interlayer insulating layer 113. The first source electrode SE1 and the first drain electrode DE1 may be formed of a conductive material, for example, copper (Cu), aluminum (Al), molybdenum (Mo), nickel (Ni), titanium (Ti), chromium (Cr) or an alloy thereof, but the present disclosure is not limited thereto.

The planarization layer 114 is disposed on the first driving transistor DT1. The planarization layer 114 is an insulating layer that protects components under the planarization layer 114, and may planarize an upper portion of the first driving transistor DT1. The planarization layer 114 may be composed of a single layer or multilayers, for example, may be formed of an acryl-based organic material, but the present disclosure is not limited thereto.

The plurality of first alignment lines 121 and the plurality of second alignment lines 122 are disposed on the planarization layer 114. The first alignment line 121 may be used as a line for applying a low potential voltage (e.g., a potential voltage lower than a potential voltage received by the first connection line 123) even after the manufacturing process described above. That is, since a low potential voltage is applied through the first alignment electrode 121E connected to the first alignment line 121 and the first alignment line 121 is in contact with the first semiconductor layer 131 of the light emitting element 130, the light emitting element 130 may receive the low potential voltage through the first alignment line 121. However, since the second alignment line 122 is covered with the first insulating layer 115, it is not used as a line for applying a voltage in the display device 100.

Also, the first alignment electrode 121E, the second alignment electrode 122E, and the first connection electrode 123E may be disposed on the planarization layer 114. The first alignment electrode 121E, the second alignment electrode 122E, and the first connection electrode 123E may all be formed of the same material as the first alignment line 121 and the second alignment line 122 at the same time, but the present disclosure is not limited thereto. The first alignment electrode 121E may be connected to the first alignment line 121, the second alignment electrode 122E may be connected to the second alignment line 122, and the first connection electrode 123E may be connected to the first drain electrode DE1 that is an output terminal of the first driving transistor DT1.

The first insulating layer 115 is disposed on the second alignment line 122 to cover the second alignment line 122. In this case, as shown in FIG. 6, the first insulating layer 115 may be disposed to cover an area of an upper surface of the first connection electrode 123E except for a contact hole.

The plurality of light emitting elements 130 are disposed on the first insulating layer 115. Each of the plurality of light emitting elements 130 is disposed in a space between the plurality of second alignment lines 122. The central portions of the plurality of light emitting elements 130 may be aligned toward the first alignment lines 121, and the both ends of the plurality of light emitting elements 130 may be aligned toward the second alignment lines 122 adjacent to the first alignment lines 121. In this case, the first semiconductor layer 131 positioned in the central portion of the light emitting element 130 is in contact with the first alignment line 121, but the second semiconductor layer 133a and the third semiconductor layer 133b are insulated from the second alignment line 122 by the first insulating layer 115.

A second insulating layer 116 is disposed on the plurality of light emitting elements 130. The second insulating layer 116 may planarize upper portions of the plurality of light emitting elements 130. The second insulating layer 116 may be composed of a single layer or multilayers, for example, may be formed of an acryl-based organic material, but is not limited thereto, and may be formed of an inorganic material.

The second insulating layer 116 includes a contact hole that exposes one end of each of the plurality of light emitting elements 130. In FIG. 6, the second insulating layer 116 is shown to expose the second semiconductor layer 133a of the light emitting element 130. However, in a process of aligning the light emitting element 130, positions where the second semiconductor layer 133a and the third semiconductor layer 133b of the light emitting element 130 will be aligned among the second alignment line 122 positioned on a left of the first alignment line 121 and the second alignment line 122 positioned on a right of the first alignment line 121 may not be predicted. That is, one of the second semiconductor layer 133a and the third semiconductor layer 133b is aligned with the second alignment line 122 positioned on the left of the first alignment line 121 and the other one of the second semiconductor layer 133a and the third semiconductor layer 133b is aligned with the second alignment line 122 positioned on the right of the first alignment line 121. Accordingly, the third semiconductor layer 133b instead of the second semiconductor layer 133a may be disposed at a position where the contact hole of the second insulating layer 116 is disposed. Accordingly, the second insulating layer 116 may include a contact hole that exposes one semiconductor layer among the second semiconductor layer 133a and the third semiconductor layer 133b.

In addition, a plurality of the first connection lines 123 are disposed on the second insulating layer 116. The plurality of first connection lines 123 may be electrically connected to the plurality of light emitting elements 130 through contact holes of the second insulating layer 116. That is, the first connection line 123 may be electrically connected to one of the second semiconductor layer 133a and the third semiconductor layer 133b of the light emitting element 130 through the contact hole of the second insulating layer 116. Also, the first connection line 123 may be connected to the first connection electrode 123E and electrically connected to the first drain electrode DE1 of the first driving transistor DT1. Accordingly, the first connection lines 123 may electrically connect the first driving transistor DT1 and the plurality of light emitting elements 130, so that the plurality of light emitting elements 130 may be driven to emit light.

In the display device 100 according to an aspect of the present disclosure, the plurality of light emitting elements 130 may be self-aligned at specific positions of the substrate 110 by configuring the light emitting elements 130 to be self-aligned.

Specifically, in the display device 100 according to an aspect of the present disclosure, on the substrate 110 on which the first driving transistor DT1 is formed, the plurality of first alignment lines 121 and the plurality of second alignment lines 122 for aligning the plurality of light emitting elements 130 may be formed and the plurality of light emitting elements 130 may be self-aligned. Specifically, electric fields may be formed on the substrate 110 by applying an AC voltage to the plurality of first alignment lines 121 and the plurality of second alignment lines 122. In addition, the plurality of light emitting elements 130 applied onto the substrate 110 may be self-aligned on the plurality of first alignment lines 121 and the plurality of second alignment lines 122 by electric fields between the plurality of first alignment lines 121 and the plurality of second alignment lines 122. Therefore, a transfer process of aligning and transferring the plurality of light emitting elements 130 at specific positions can be simplified. In addition, the plurality of first connection lines 123 may be formed on the plurality of self-aligned light emitting elements 130, so that the plurality of light emitting elements 130 may be driven.

Accordingly, in the display device 100 according to an aspect of the present disclosure, by configuring the light emitting elements 130 to be self-aligned, the plurality of light emitting elements 130 are self-aligned at specific positions on the substrate 110, so that it is possible to simplify the transfer process of the light emitting elements 130 and reduce manufacturing costs.

In addition, the light emitting element 130 according to an aspect of the present disclosure is configured to include two light emitting areas. That is, the light emitting element 130 may include one light emitting area that is formed by the first semiconductor layer 131 formed of an n-type semiconductor material, the first active layer 132a, and the second semiconductor layer 133a formed of a p-type semiconductor material, and the other light emitting area that is formed by the first semiconductor layer 131 formed of an n-type semiconductor material, the second active layer 132b, and the third semiconductor layer 133b formed of a p-type semiconductor material. Accordingly, when the first connection line 123 is connected to the second semiconductor layer 133a as shown in FIG. 6, light may be emitted through the light emitting area that is formed by the first semiconductor layer 131, the first active layer 132a, and the second semiconductor layer 133a. In addition, although not shown in the drawings, when the first connection line 123 is connected to the third semiconductor layer 133b, light may be emitted through the light emitting area that is formed by the first semiconductor layer 131, the second active layer 132b, and the third semiconductor layer 133b. Accordingly, in the display device 100 according to an aspect of the present disclosure, even in a case in which the light emitting elements 130 are aligned in any direction, one of the two light emitting areas of the light emitting element 130 may be used to emit light.

Figure 7:
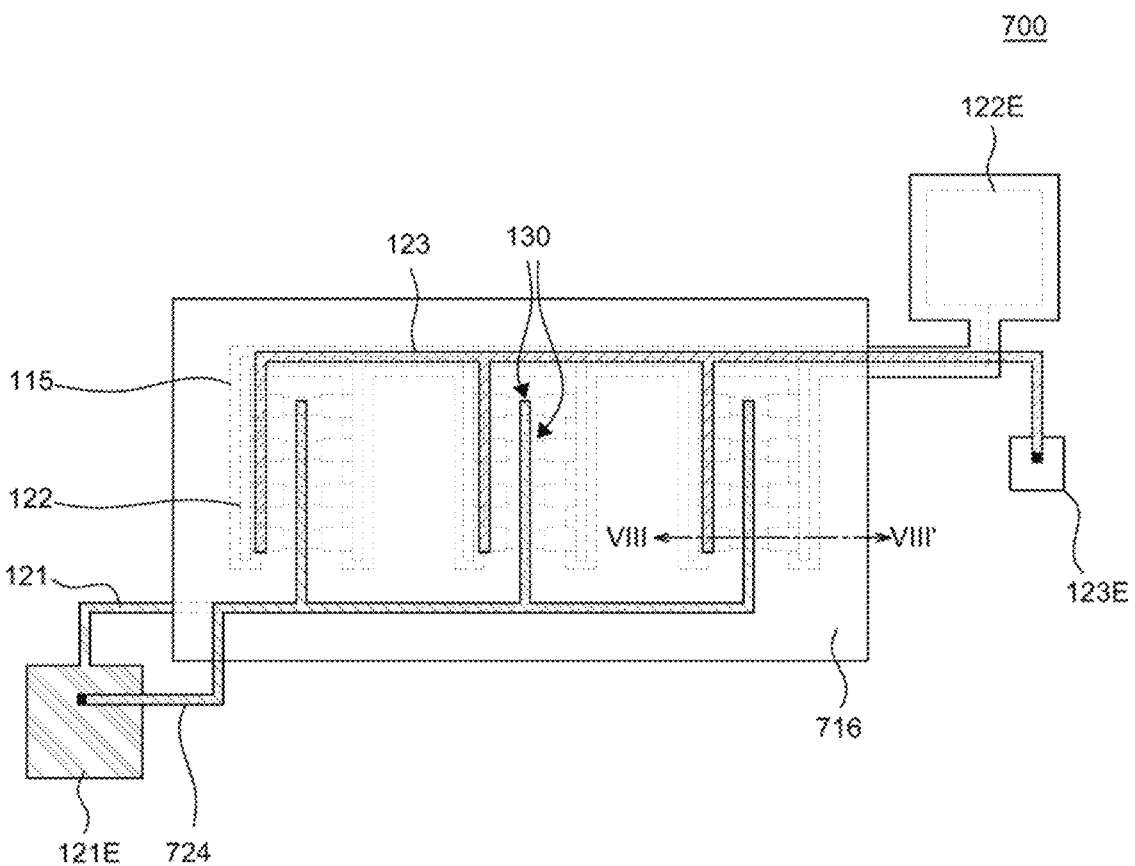
FIG. 7 is a plan view of a display device according to another aspect of the present disclosure.
Figure 8:
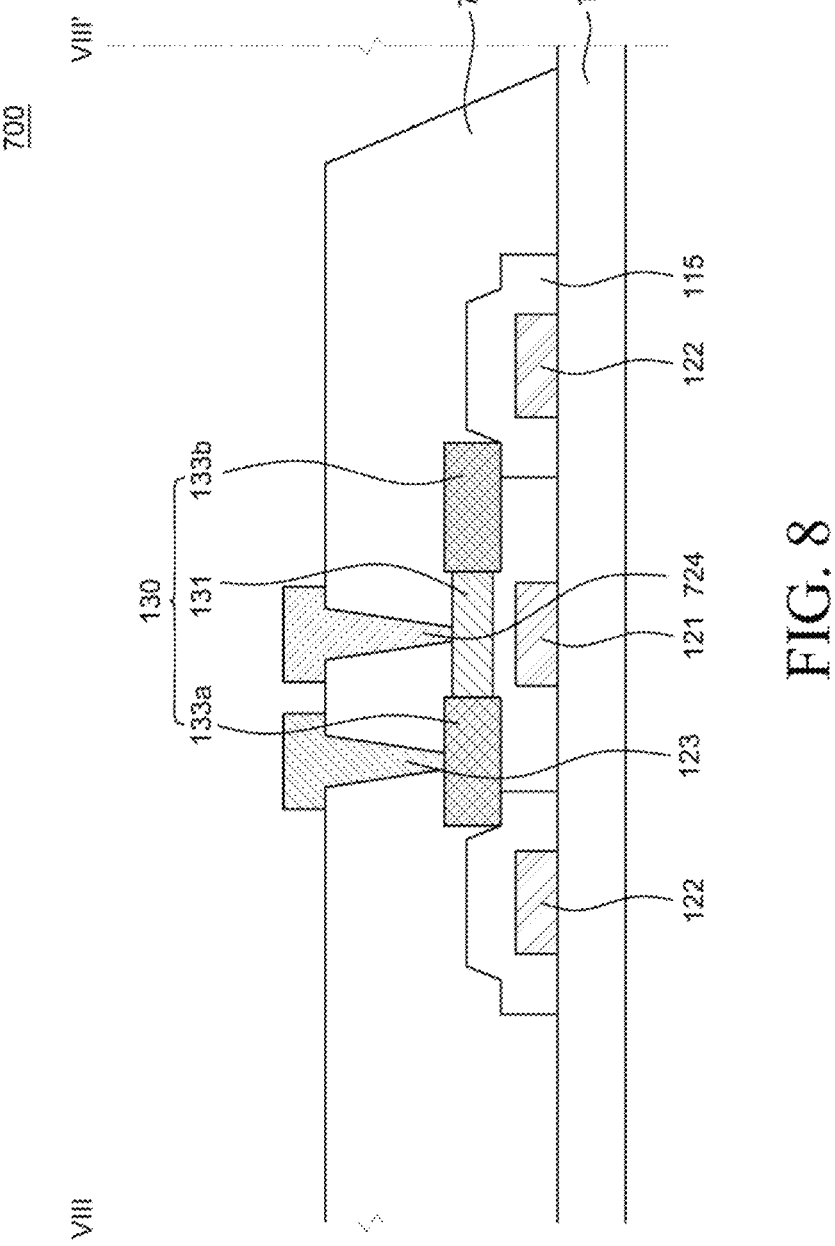
FIG. 8 is a cross-sectional view taken along line VIII-VIII' of FIG. 7.

FIG. 7 is a plan view of a display device according to another aspect of the present disclosure. FIG. 8 is a cross-sectional view taken along line VIII-VIII' of FIG. 7. A display device 700 of FIGS. 7 and 8 is different from the display device 100 of FIGS. 5 and 6 only in terms of further including a second connection line 724 and in terms of a connection relationship of a second insulating layer 716, the first alignment line 121 and the light emitting element 130, but other configurations thereof are substantially the same as those of the display device 100 of FIGS. 5 and 6. Thus, redundant descriptions thereof will be omitted.

First, referring to FIG. 8, the first semiconductor layer 131 of the light emitting element 130 may be spaced apart from the first alignment line 121. That is, after the self-alignment process of the light emitting element 130 is completed, the first semiconductor layer 131 may be spaced apart from the first alignment line 121 without being in contact with the first alignment line 121.

Referring to FIGS. 7 and 8, the second connection line 724 may be disposed to transmit a low potential voltage to the light emitting element 130. The second connection line 724 may be connected to the first alignment electrode 121E and receive a low potential voltage. Also, the second insulating layer 716 may include a contact hole that exposes the first semiconductor layer 131. Accordingly, the second insulating layer 716 may expose an upper portion of the first semiconductor layer 131. The second connection line 724 may be disposed on the first semiconductor layer 131 that is exposed by the second insulating layer 716 and in contact with the first semiconductor layer 131. Accordingly, the second connection line 724 connects the first alignment electrode 121E to which the low potential voltage is supplied and the first semiconductor layer 131 of the light emitting element 130, so that the low potential voltage may be transmitted to the first semiconductor layer 131.

The light emitting element 130 may not be accurately aligned due to an error in a manufacturing process of the light emitting element 130 or an error in a process of self-aligning the light emitting element 130 in the display device 700. For example, although the first semiconductor layer 131 of the light emitting element 130 is designed to be in contact with the first alignment line 121 after the self-alignment process is completed, the first semiconductor layer 131 may not be finally in contact with the first alignment line 121 due to various errors described above. In this case, since the first semiconductor layer 131 is not supplied with the low potential voltage, a defect in which the light emitting element 130 does not emit light may occur. In addition, in a process of self-aligning the plurality of light emitting elements 130, a defect in which the first semiconductor layer 131 of a portion of the plurality of light emitting elements 130 is in contact with the first alignment line 121, while the first semiconductor layer 131 of another portion of the plurality of light emitting elements 130 is not in contact with the first alignment line 121 may also occur. In this case, since a difference in the number of the light emitting elements 130 that are normally connected may occur between the plurality of sub-pixels SP, a defect in which luminance is not uniform in the respective sub-pixels SP may also occur.

Accordingly, in the display device 700 according to another aspect of the present disclosure, the second insulating layer 716 includes a contact hole that exposes the upper portion of the first semiconductor layer 131, and the second connection line 724 that transmits a low potential voltage is in contact with the first semiconductor layer 131 exposed by the second insulating layer 716, so that the low potential voltage may be normally transmitted to the light emitting element 130. Accordingly, even when the first semiconductor layers 131 of all the light emitting elements 130 are not in contact with the first alignment lines 121 due to various errors, a low potential voltage may be transferred to the first semiconductor layer 131 of the light emitting element 130 through the second connection line 724. Also, even when the first semiconductor layers 131 of some light emitting elements 130 are not in contact with the first alignment lines 121, since a repair process may be very easily performed so that the first semiconductor layers 131 of the corresponding some light emitting elements 130 receive a low potential voltage through the second connection line 724, luminance uniformity between the sub-pixels SP may be improved. In addition, by reducing the number of the light emitting elements 130 that do not emit light among the plurality of light emitting elements 130 that are self-aligned in one sub-pixel SP, luminous efficiency compared to the number of the light emitting elements 130 that are input can be maximized.

Figure 9:
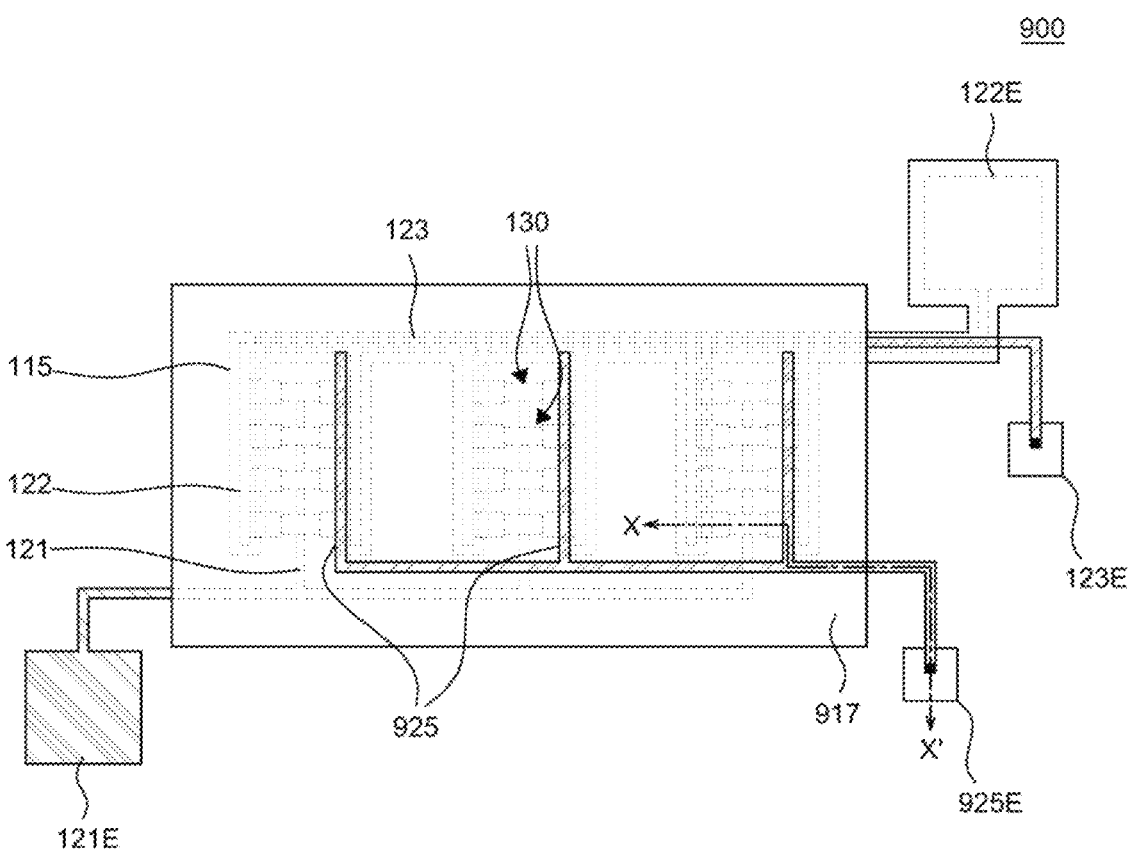
FIG. 9 is a plan view of a display device according to sill another aspect of the present disclosure.
Figure 10:
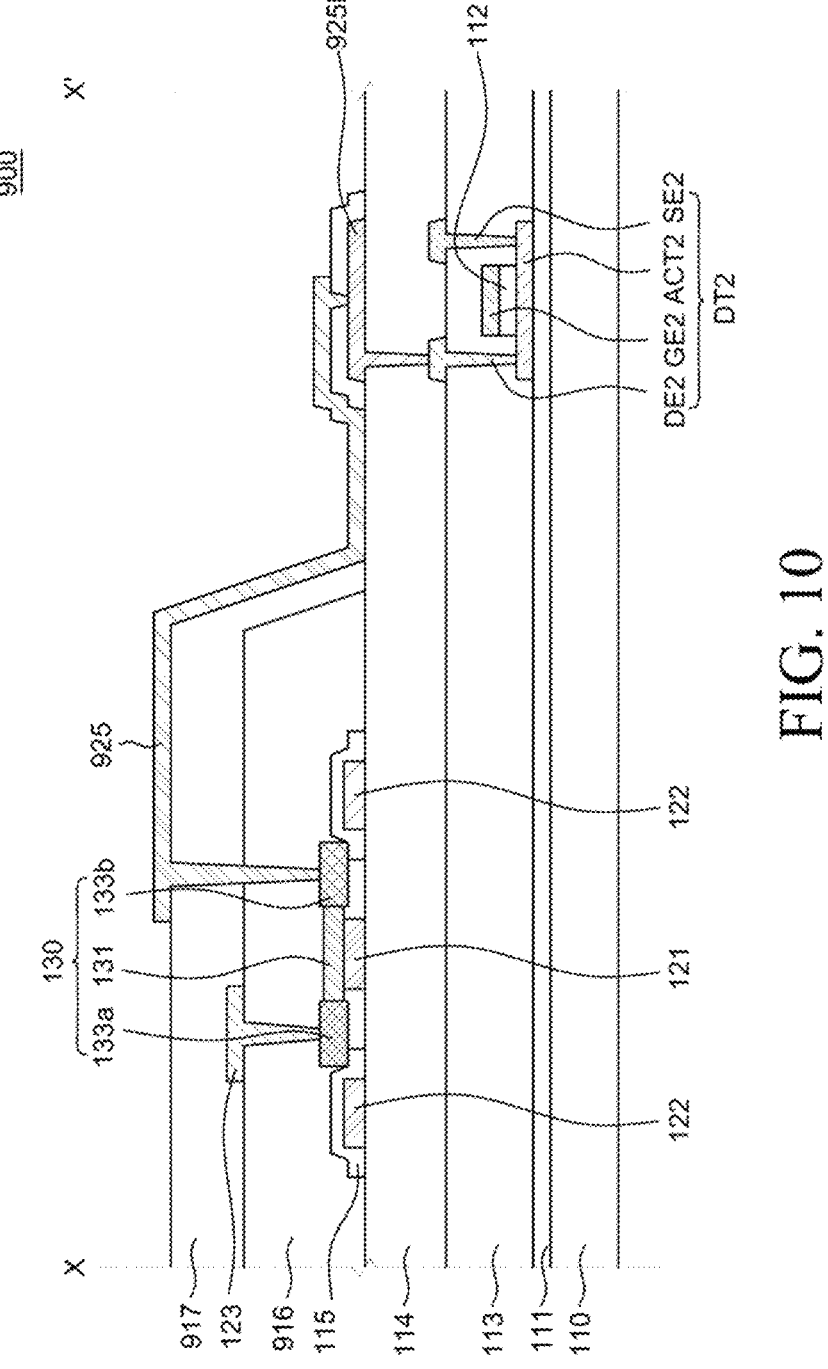
FIG. 10 is a cross-sectional view taken along line IX-IX' of FIG. 9.

FIG. 9 is a plan view of a display device according to sill another aspect of the present disclosure. FIG. 10 is a cross-sectional view taken along line IX-IX' of FIG. 9. A display device 900 of FIGS. 9 and 10 is different from the display device 100 of FIGS. 5 and 6 only in terms of further including a second driving transistor DT2, a third insulating layer 917, a third connection electrode 925E, and third connection lines 925 and in terms of a second insulating layer 916, but other configurations thereof are substantially the same as those of the display device 100 of FIGS. 5 and 6. Thus, redundant descriptions thereof will be omitted.

The second driving transistor DT2 is disposed on the substrate 110 and the buffer layer 111. The second driving transistor DT2 includes a second active layer ACT2, a second gate electrode GE2, a second source electrode SE2, and a second drain electrode DE2.

First, the second active layer ACT2 is disposed on the buffer layer 111. The second active layer ACT2 may be formed of a semiconductor material such as an oxide semiconductor, amorphous silicon, or polysilicon, but is not limited thereto.

The gate insulating layer 112 is disposed on the second active layer ACT2. The gate insulating layer 112 is an insulating layer for insulating the second active layer ACT2 and the second gate electrode GE2, and may be composed of a single layer or multilayers of silicon oxide (SiOx) or silicon nitride (SiNx), but the present disclosure is not limited thereto.

The second gate electrode GE2 is disposed on the gate insulating layer 112. The second gate electrode GE2 may be formed of a conductive material, for example, copper (Cu), aluminum (Al), molybdenum (Mo), nickel (Ni), titanium (Ti), chromium (Cr), or an alloy thereof, but is not limited thereto.

The interlayer insulating layer 113 is disposed on the second gate electrode GE2. Contact holes for connecting each of the second source electrode SE2 and the second drain electrode DE2 to the second active layer ACT2 are formed in the interlayer insulating layer 113. The interlayer insulating layer 113 is an insulating layer for protecting components under the interlayer insulating layer 113, and may be composed of a single layer or multilayers of silicon oxide (SiOx) or silicon nitride (SiNx), but the present disclosure is not limited thereto.

The second source electrode SE2 and the second drain electrode DE2 are disposed on the interlayer insulating layer 113. Each of the second source electrode SE2 and the second drain electrode DE2 may be electrically connected to the second active layer ACT2 through the contact holes formed in the interlayer insulating layer 113. The second source electrode SE2 and the second drain electrode DE2 may be formed of a conductive material, for example, copper (Cu), aluminum (Al), molybdenum (Mo), nickel (Ni), titanium (Ti), or chromium (Cr) or an alloy thereof, but the present disclosure is not limited thereto.

The planarization layer 114 is disposed on the second driving transistor DT2, and the third connection electrode 925E is disposed on the planarization layer 114. The third connection electrode 925E may be connected to the second drain electrode DE2 which is an output terminal of the second driving transistor DT2.

Referring to FIG. 10, the third insulating layer 917 is disposed to cover the first connection line 123 and the second insulating layer 916. In this case, the second insulating layer 916 and the third insulating layer 917 may expose a semiconductor layer that is different from a semiconductor layer in contact with the first connection line 123. For example, as shown in FIG. 10, when the semiconductor layer in contact with the first connection line 123 is the second semiconductor layer 133a, the second insulating layer 916 and the third insulating layer 917 may further include a contact hole that exposes the third semiconductor layer 133b.

Referring to FIG. 10, a plurality of the third connection lines 925 are disposed on the third insulating layer 917. That is, the third connection line 925 may be disposed on a layer different from that of the first connection line 123. The plurality of third connection lines 925 may be electrically connected to the plurality of light emitting elements 130 through contact holes of the second insulating layer 916 and the third insulating layer 917. That is, the third connection line 925 may be electrically connected to the other semiconductor layer that is different from one semiconductor layer to which the first connection line 123 is connected among the second semiconductor layer 133a and the third semiconductor layer 133b of the light emitting element 130 through the contact hole of the second insulating layer 916 and the third insulating layer 917. That is, when the first connection line 123 is connected to the second semiconductor layer 133a, the third connection line 925 may be connected to the third semiconductor layer 133b, and when the first connection line 123 is connected to the third semiconductor layer 133b, the third connection line 925 may be connected to the second semiconductor layer 133a. In addition, the third connection line 925 may be connected to the third connection electrode 925E and electrically connected to the second drain electrode DE2 of the second driving transistor DT2. Accordingly, the third connection lines 925 may electrically connect the second driving transistor DT2 and the plurality of light emitting elements 130, so that the plurality of light emitting elements 130 may be driven to emit light.

The first driving transistor DT1 and the second driving transistor DT2 may be driven independently or may be driven together. For example, the first driving transistor DT1 may be driven independently regardless of whether the second driving transistor DT2 is driven. Alternatively, the first driving transistor DT1 and the second driving transistor DT2 may be connected to the same line, so that the first driving transistor DT1 and the second driving transistor DT2 may be driven in the same manner.

In the display device 900 according to still another aspect of the present disclosure, the light emitting element 130 is configured to include two light emitting areas, so that it may include a structure allowing for easy repair. That is, the light emitting element 130 may include one light emitting area that is formed by the first semiconductor layer 131 formed of an n-type semiconductor material, the first active layer 132a, and the second semiconductor layer 133a formed of a p-type semiconductor material, and the other light emitting area that is formed by the first semiconductor layer 131 formed of an n-type semiconductor material, the second active layer 132b, and the third semiconductor layer 133b formed of a p-type semiconductor material. Accordingly, repair is possible even when the first connection line 123 is connected to the second semiconductor layer 133a as shown in FIG. 10. For example, the light emitting area that is formed by the first semiconductor layer 131, the first active layer 132a, and the second semiconductor layer 133a may be defective due to a manufacturing process or the like, and thus, light may not be normally emitted therefrom. Alternatively, the light emitting element 130 may not normally emit light because the first connection line 123 is not normally connected to the second semiconductor layer 133a. In the display device 900 according to still another aspect of the present disclosure, in order to solve a defect that occurs when the first connection line 123 is designed to be connected to the second semiconductor layer 133a, the third connection line 925 that is connected to the third semiconductor layer 133b that is different from the second semiconductor layer 133a may be additionally disposed. Accordingly, when a defect occurs in the light emitting area that is formed by the first semiconductor layer 131, the first active layer 132a and the second semiconductor layer 133a, the light emitting element 130 may normally emit light through the light emitting area that is formed by the first semiconductor layer 131, the second active layer 132b and the third semiconductor layer 133b. Also, even if a defect in which the first connection line 123 is not normally connected to the second semiconductor layer 133a occurs, the third semiconductor layer 133b and the second driving transistor DT2 may be connected through the third connection line 925, so that the light emitting element 130 can emit light normally. Accordingly, the display device 900 according to still another aspect of the present disclosure may include a repairable structure including the light emitting elements 130 having two light emitting areas.

Meanwhile, even when there is no defect in the light emitting area or connection through the first connection line 123 and the second semiconductor layer 133a, the third connection line 925 and the third semiconductor layer 133b may be connected to each other.

In this case, the first driving transistor DT1 and the second driving transistor DT2 may be driven independently. For example, during a first time period, the first driving transistor DT1 may be driven to emit light through the light emitting area that is formed by the first semiconductor layer 131, the first active layer 132a, and the second semiconductor layer 133a and during a second time period, the second driving transistor DT2 may be driven to emit light through the light emitting area that is formed by the first semiconductor layer 131, the second active layer 132b and the third semiconductor layer 133b. As described above, as the first driving transistor DT1 and the second driving transistor DT2 are alternately driven, the two light emitting areas may be alternately used. Accordingly, in the display device 900 according to still another aspect of the present disclosure, the two light emitting areas of the light emitting element 130 may be efficiently used, and thus a lifespan of the light emitting element may be improved.

Also, the first driving transistor DT1 and the second driving transistor DT2 may be driven together. That is, the first driving transistor DT1 and the second driving transistor DT2 may be driven together in the same manner during all time periods. Accordingly, in the display device 900 according to still another aspect of the present disclosure, as the two light emitting areas of the light emitting element 130 are configured to emit light at the same time, luminance may be improved and luminous efficiency may be improved.

Figure 11:
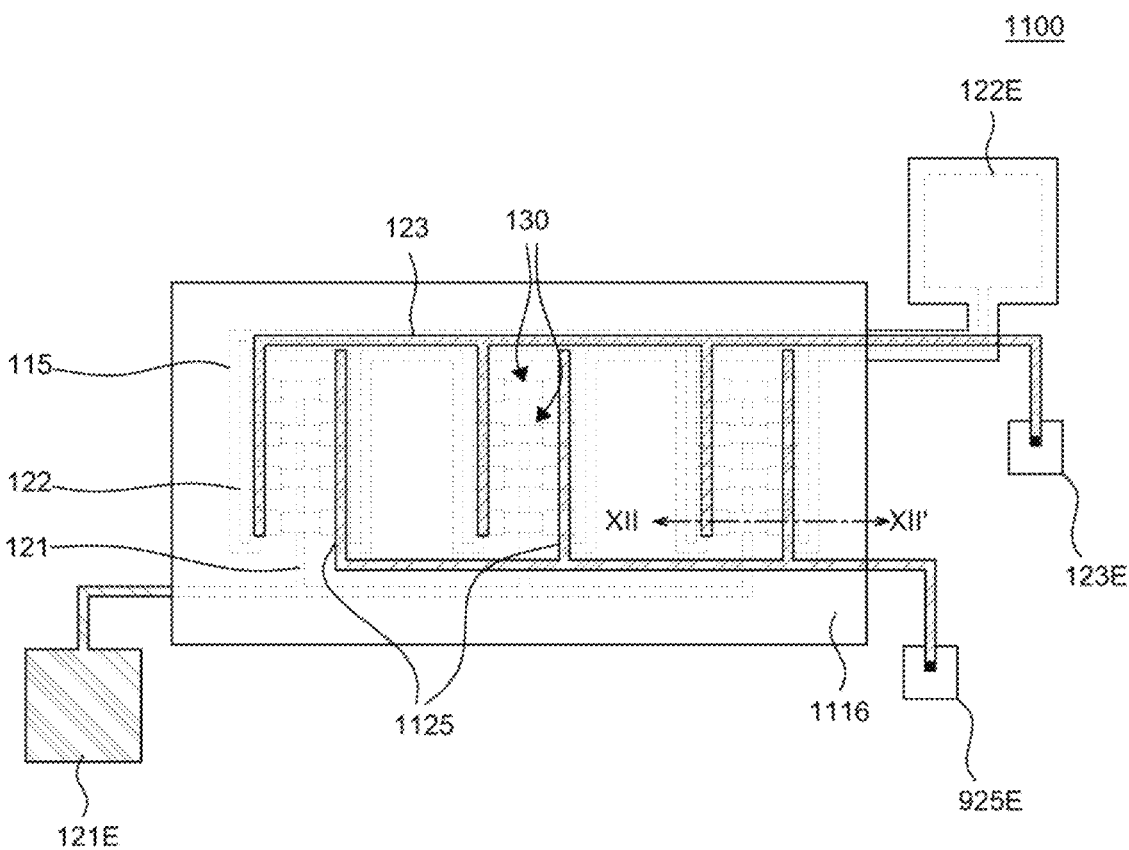
FIG. 11 is a plan view of a display device according to still another aspect of the present disclosure.
Figure 12:
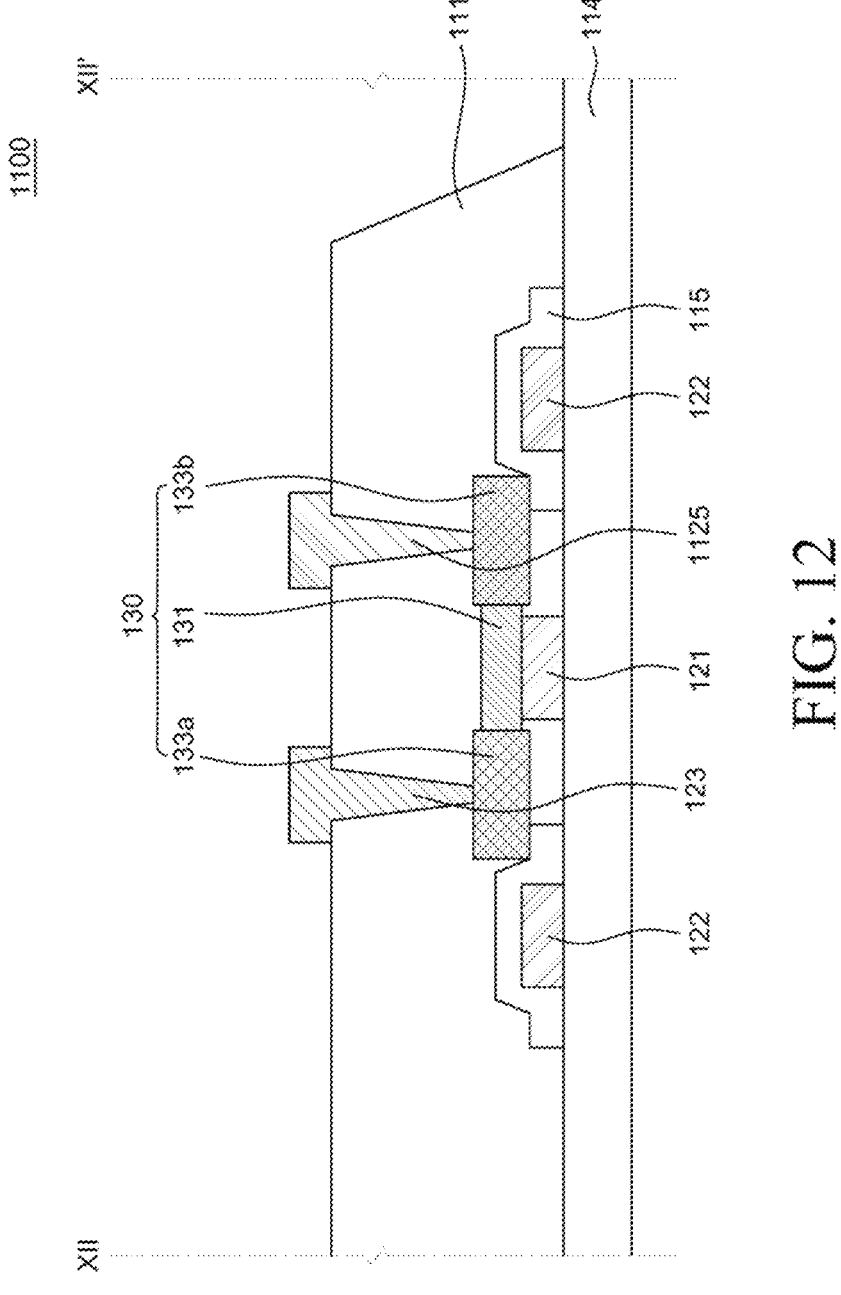
FIG. 12 is a cross-sectional view taken along line XI-XI' of FIG. 11.

FIG. 11 is a plan view of a display device according to still another aspect of the present disclosure. FIG. 12 is a cross-sectional view taken along line XI-XI' of FIG. 11. A display device 1100 of FIGS. 11 and 12 is different from the display device 900 of FIGS. 9 and 10 only in that the third insulating layer 917 is omitted therefrom and in terms of fourth connection lines 1125, but other configurations thereof are substantially the same as those of the display device 900 of FIGS. 9 and 10. Thus, redundant descriptions thereof will be omitted.

Referring to FIG. 12, a second insulating layer 1116 may expose a semiconductor layer that is different from a semiconductor layer in contact with the first connection line 123. For example, as shown in FIG. 12, when the semiconductor layer in contact with the first connection line 123 is the second semiconductor layer 133a, the second insulating layer 1116 may further include a contact hole that exposes the third semiconductor layer 133b.

Referring to FIGS. 11 and 12, a plurality of the fourth connection lines 1125 are disposed on the second insulating layer 1116. That is, the fourth connection line 1125 may be disposed on the same layer as the first connection line 123. The plurality of fourth connection lines 1125 may be electrically connected to the plurality of light emitting elements 130 through contact holes of the second insulating layer 1116. That is, the fourth connection line 1125 may be electrically connected to the other semiconductor layer that is different from one semiconductor layer to which the first connection line 123 is connected among the second semiconductor layer 133a and the third semiconductor layer 133b of the light emitting element 130 through the contact hole of the second insulating layer 1116. That is, when the first connection line 123 is connected to the second semiconductor layer 133a, the fourth connection line 1125 may be connected to the third semiconductor layer 133b, and when the first connection line 123 is connected to the third semiconductor layer 133b, the fourth connection line 1125 may be connected to the second semiconductor layer 133a. In addition, the fourth connection line 1125 may be connected to the third connection electrode 925E and electrically connected to the second drain electrode DE2 of the second driving transistor DT2. Accordingly, the fourth connection lines 1125 may electrically connect the second driving transistor DT2 and the plurality of light emitting elements 130, so that the plurality of light emitting elements 130 may be driven to emit light.

In the display device 1100 according to still another aspect of the present disclosure, the light emitting element 130 is configured to include two light emitting areas, so that it may include a structure allowing for easy repair. That is, in the display device 1100 according to still another aspect of the present disclosure, in order to solve a defect that occurs when the first connection line 123 is designed to be connected to the second semiconductor layer 133a, the fourth connection line 1125 that is connected to the third semiconductor layer 133b that is different from the second semiconductor layer 133a may be additionally disposed. Accordingly, when a defect occurs in the light emitting area that is formed by the first semiconductor layer 131, the first active layer 132a and the second semiconductor layer 133a, the light emitting element 130 may normally emit light through the light emitting area that is formed by the first semiconductor layer 131, the second active layer 132b and the third semiconductor layer 133b. Also, even if a defect in which the first connection line 123 is not normally connected to the second semiconductor layer 133a occurs, the third semiconductor layer 133b and the second driving transistor DT2 may be connected through the fourth connection line 1125, so that the light emitting element 130 can emit light normally. Accordingly, the display device 1100 according to still another aspect of the present disclosure may include a repairable structure including the light emitting elements 130 having two light emitting areas.

In addition, in the display device 1100 according to still another aspect of the present disclosure, the first connection line 123 and the fourth connection line 1125 are formed at the same time, so that the fourth connection line 1125 for repair may be formed in the same process as the connection line 123. That is, the fourth connection line 1125 for repair is formed of the same material on the same layer as the first connection line 123, so that the first connection line 123 and the fourth connection line 1125 may be formed simultaneously through a single mask process. That is, when no defect occurs, it is not necessary to drive the second driving transistor DT2 connected to the fourth connection line 1125, so the first connection line 123 and the fourth connection line 1125 may be formed at the same time. Accordingly, in the display device 1100 according to still another aspect of the present disclosure, since the fourth connection line 1125 for repair can be formed without an additional process, a process procedure that is consumed in a repair process may decrease and a manufacturing cost may be reduced.

The aspects of the present disclosure can also be described as follows:

A nanorod light emitting element according to an aspect of the present disclosure may include a first semiconductor layer having a rod shape, a first active layer covering a first portion of a side surface of the first semiconductor layer, the first portion extending from an upper surface of the first semiconductor layer, a second semiconductor layer covering the first active layer, a second active layer covering a second portion of the side surface, the second portion extending from a lower surface of the first semiconductor layer, and spaced apart from the first active layer, and a third semiconductor layer covering the second active layer and spaced apart from the second semiconductor layer.

The first active layer and the second active layer are formed of the same material.

The second semiconductor layer and the third semiconductor layer may be formed of the same material.

The first active layer may further cover an entirety of the upper surface of the first semiconductor layer.

The first active layer exposes the upper surface of the first semiconductor layer.

The second active layer may expose the lower surface of the first semiconductor layer.

A display device according to another aspect of the present disclosure may include a substrate including an active area including a plurality of sub-pixels and a non-active area surrounding the active area, a first transistor disposed on the substrate, a planarization layer disposed on the first transistor, a first alignment lines disposed on the planarization layer, a second alignment lines positioned on both sides of the first alignment lines, a first insulating layer disposed to cover the second alignment lines, a nanorod light emitting element disposed on the first alignment line and the first insulating layer, a second insulating layer disposed on the nanorod light emitting element and exposing one semiconductor layer among the second semiconductor layer and the third semiconductor layer, and a first connection line connecting the first transistor and the one semiconductor layer.

The first alignment line may be in contact with the first semiconductor layer.

The first alignment line may be configured to receive a potential voltage lower than a potential voltage received by the first connection line.

The display device may further comprise, a second connection line disposed on the first semiconductor layer and in contact with the first semiconductor layer.

The second insulating layer may expose the first semiconductor layer.

The second connection line may be in contact with the first semiconductor layer that is exposed by the second insulating layer.

The first semiconductor layer may be spaced apart from the first alignment line.

The display device may further comprise, a second transistor disposed on the substrate; and a third connection line connecting the second transistor and the other semiconductor layer among the second semiconductor layer and the third semiconductor layer.

The second insulating layer may expose the other semiconductor layer.

The third connection line may be in contact with the other semiconductor layer that is exposed by the second insulating layer.

The first connection line and the third connection line may be disposed on the same layer and formed of the same material.

The display device may further comprise, a third insulating layer covering the first connection line and the second insulating layer, wherein the third insulating layer exposes the other semiconductor layer.

The third connection line may be in contact with the other semiconductor layer that is exposed by the second insulating layer and the third insulating layer.

The first connection line and the third connection line may dispose on different layers.

A display device according to still another aspect of the present disclosure may comprise a substrate and a plurality of sub-pixels disposed on the substrate. One of the plurality of sub-pixels comprises a plurality of nanorod light emitting elements, each of which is the nanorod light emitting element mentioned above.

Although the aspects of the present disclosure have been described in detail with reference to the accompanying drawings, the present disclosure is not limited thereto and may be embodied in many different forms without departing from the technical concept of the present disclosure. Therefore, the aspects of the present disclosure are provided for illustrative purposes only but not intended to limit the technical concept of the present disclosure. The scope of the technical concept of the present disclosure is not limited thereto. Therefore, it should be understood that the above-described aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A nanorod light emitting element, comprising:
a first semiconductor layer having a rod shape with an upper surface at one end of the rod shape, a lower surface at an opposite end of the rod shape, and a side surface extending along a longitudinal direction of the rod shape from the upper surface to the lower surface;
a first active layer covering an outer circumferential surface of a first portion of the side surface of the first semiconductor layer, the first portion of the side surface extending from the upper surface of the first semiconductor layer;
a second semiconductor layer covering an outer circumferential surface of the first active layer;
a second active layer covering an outer circumferential surface of a second portion of the side surface, the second portion of the side surface extending from the lower surface of the first semiconductor layer, and the second active layer spaced apart from the first active layer; and
a third semiconductor layer covering an outer circumferential surface of the second active layer and spaced apart from the second semiconductor layer.

2. The nanorod light emitting element of claim 1, wherein the first active layer and the second active layer are formed of a same material, and
wherein the second semiconductor layer and the third semiconductor layer are formed of a same material.

3. The nanorod light emitting element of claim 1, wherein the first active layer further covers the upper surface of the first semiconductor layer.

4. The nanorod light emitting element of claim 1, wherein the first active layer exposes the upper surface of the first semiconductor layer.

5. The nanorod light emitting element of claim 1, wherein the second active layer exposes the lower surface of the first semiconductor layer.

6. A display device, comprising:
a substrate including an active area including a plurality of sub-pixels and a non-active area surrounding the active area;
a first transistor disposed on the substrate;
a planarization layer disposed on the first transistor;
a first alignment line disposed on the planarization layer;
a second alignment line positioned on both sides of the first alignment line;
a first insulating layer covering the second alignment line;
a nanorod light emitting element disposed on the first alignment line and the first insulating layer,
wherein the nanorod light emitting element comprises:
a first semiconductor layer having a rod shape with an upper surface at one end of the rod shape, a lower surface at an opposite end of the rod shape, and a side surface at an opposite end of the rod shape, and a side surface extending along a longitudinal direction of the rod shape from the upper surface to the lower surface;

a first active layer covering an outer circumferential surface of a first portion of the side surface of the first semiconductor layer, the first portion of the side surface extending from the upper surface of the first semiconductor layer;

a second semiconductor layer covering an outer circumferential surface of the first active layer;

a second active layer covering an outer circumferential surface of a second portion of the side surface, the second portion of the side surface extending from the lower surface of the first semiconductor layer, and the second active layer spaced apart from the first active layer; and a third semiconductor layer covering an outer circumferential surface of the second active layer and spaced apart from the second semiconductor layer;

a second insulating layer disposed on the nanorod light emitting element and exposing one of the second semiconductor layer and the third semiconductor layer; and a first connection line connecting the first transistor and the one of the second semiconductor layer and the third semiconductor layer.

7. The display device of claim 6, wherein the first alignment line is in contact with the first semiconductor layer.

8. The display device of claim 7, wherein the first alignment line is configured to receive a potential voltage lower than a potential voltage received by the first connection line.

9. The display device of claim 6, further comprising a second connection line disposed on the first semiconductor layer and in contact with the first semiconductor layer.

10. The display device of claim 9, wherein the second insulating layer exposes the first semiconductor layer, and wherein the second connection line is in contact with the first semiconductor layer that is exposed by the second insulating layer.

11. The display device of claim 6, wherein the first semiconductor layer is spaced apart from the first alignment line.

12. The display device of claim 6, further comprising:

a second transistor disposed on the substrate; and a third connection line connecting the second transistor and another one of the second semiconductor layer and the third semiconductor layer.

13. The display device of claim 12, wherein the second insulating layer exposes another one of the second semiconductor layer and the third semiconductor layer, and wherein the third connection line is in contact with the another one of the second semiconductor layer and the third semiconductor layer that is exposed by the second insulating layer.

14. The display device of claim 12, wherein the first connection line and the third connection line are disposed on a same layer and formed of a same material.

15. The display device of claim 12, further comprising a third insulating layer covering the first connection line and the second insulating layer.

16. The display device of claim 15, wherein the third insulating layer exposes the another one of the second semiconductor layer and the third semiconductor layer, and wherein the third connection line is in contact with the another one of the second semiconductor layer and the third semiconductor layer that is exposed by the second insulating layer and the third insulating layer.

17. The display device of claim 12, wherein the first connection line and the third connection line are disposed on different layers.

18. A display device, comprising:

a substrate; and a plurality of sub-pixels disposed on the substrate, wherein one of the plurality of sub-pixels comprises a plurality of nanorod light emitting elements, and wherein the nanorod light emitting element comprises:

a first semiconductor layer having a rod shape with an upper surface at one end of the rod shape, a lower surface at an opposite end of the rod shape, and a side surface extending along a longitudinal direction of the rod shape from the upper surface to the lower surface;

a first active layer covering an outer circumferential surface of a first portion of the side surface of the first semiconductor layer, the first portion of the side surface extending from the upper surface of the first semiconductor layer;

a second semiconductor layer covering an outer circumferential surface of the first active layer;

a second active layer covering an outer circumferential surface of a second portion of the side surface, the second portion of the side surface extending from the lower surface of the first semiconductor layer, and the second active layer spaced apart from the first active layer; and a third semiconductor layer covering an outer circumferential surface of the second active layer and spaced apart from the second semiconductor layer.

* * * * *